US009357681B2

United States Patent
Ross et al.

(10) Patent No.: US 9,357,681 B2
(45) Date of Patent: May 31, 2016

(54) MODULAR DATA CENTER ROW INFRASTRUCTURE

(71) Applicant: Amazon Technologies, Inc., Reno, NV (US)

(72) Inventors: Peter George Ross, Olympia, WA (US); Matthew Thomas Phillips, Bainbridge Island, WA (US); Alan Donald Gillooly, Auburn, WA (US); Paul Andrew Churnock, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 191 days.

(21) Appl. No.: 14/285,498

(22) Filed: May 22, 2014

(65) Prior Publication Data

US 2015/0342094 A1 Nov. 26, 2015

(51) Int. Cl.
*H05K 7/20* (2006.01)
*H01L 23/473* (2006.01)

(52) U.S. Cl.
CPC ........ *H05K 7/20736* (2013.01); *H05K 7/20745* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| 7,430,118 | B1 | 9/2008 | Noteboom et al. |
| 2006/0139877 | A1* | 6/2006 | Germagian ........ H05K 7/20745 361/695 |

(Continued)

FOREIGN PATENT DOCUMENTS

WO 2004049773 6/2004

OTHER PUBLICATIONS

AK, "Drive-In Pallet Rack Systems", downloaded May 21, 2014, pp. 1-2.

(Continued)

*Primary Examiner* — Anthony Haughton
*Assistant Examiner* — Razmeen Gafur
(74) *Attorney, Agent, or Firm* — Robert C. Kowert; Meyertons, Hood, Kivlin, Kowert & Goetzel, P.C.

(57) ABSTRACT

A data center row infrastructure module enables rapid deployment of a computing room enclosure for computer systems that provides intake air circulation to, and exhaust air removal from, the computer systems in the enclosure. The data center row infrastructure module includes free-standing exhaust plenum structures encompassing opposite sides of the enclosure and a plenum module spanning a top end of the enclosure between the free-standing exhaust plenum structures. Each free-standing exhaust plenum structure includes an internal exhaust air plenum that directs exhaust air received from the enclosure through an exhaust air outlet on a top end of the free-standing exhaust plenum structure. The plenum module establishes a bottom end of a cooling air plenum above and separate from the enclosure and between the free-standing exhaust plenum structures. Some plenum modules can direct cooling air directly to the enclosure as intake air. Some plenum modules can mix cooling air with recirculated exhaust to provide the intake air.

20 Claims, 10 Drawing Sheets

(56) References Cited

U.S. PATENT DOCUMENTS

| | | | | |
|---|---|---|---|---|
| 2007/0165377 A1* | 7/2007 | Rasmussen | H05K 7/2079 | 361/695 |
| 2008/0024977 A1* | 1/2008 | Coglitore | H05K 7/20736 | 361/679.49 |
| 2008/0174954 A1* | 7/2008 | VanGilder | H05K 7/20836 | 361/679.54 |
| 2008/0180908 A1* | 7/2008 | Wexler | H05K 7/20745 | 361/690 |
| 2009/0061755 A1* | 3/2009 | Calder | H05K 7/20736 | 454/184 |
| 2009/0086434 A1* | 4/2009 | Hodes | H05K 7/20754 | 361/700 |
| 2009/0122484 A1* | 5/2009 | Caveney | H05K 7/20736 | 361/692 |
| 2009/0251860 A1* | 10/2009 | Belady | H05K 7/20745 | 361/690 |
| 2010/0003911 A1 | 1/2010 | Graczyk et al. | | |
| 2010/0149754 A1* | 6/2010 | Chapel | H05K 7/20745 | 361/696 |
| 2010/0223085 A1* | 9/2010 | Gauthier | G06F 1/182 | 709/200 |
| 2010/0263830 A1* | 10/2010 | Noteboom | H05K 7/2079 | 165/80.2 |
| 2011/0063778 A1* | 3/2011 | Brouillard | H05K 7/20645 | 361/678 |
| 2011/0128699 A1* | 6/2011 | Heydari | H05K 7/20745 | 361/679.48 |
| 2011/0223849 A1* | 9/2011 | Ishimine | F24F 3/044 | 454/184 |
| 2011/0242755 A1* | 10/2011 | Zeighami | F24F 11/0001 | 361/679.46 |
| 2012/0063082 A1* | 3/2012 | Chang | H05K 7/20745 | 361/679.47 |
| 2012/0063087 A1* | 3/2012 | Wei | H05K 7/20745 | 361/696 |
| 2012/0162883 A1* | 6/2012 | Jai | G06F 1/181 | 361/679.02 |
| 2012/0200206 A1* | 8/2012 | Schmitt | G06F 1/181 | 312/107 |
| 2012/0243157 A1* | 9/2012 | Chen | G06F 1/181 | 361/679.02 |
| 2012/0274193 A1* | 11/2012 | Qin | G06F 1/181 | 312/236 |
| 2012/0274194 A1* | 11/2012 | Qin | G06F 1/181 | 312/236 |
| 2013/0120931 A1* | 5/2013 | Sankar | H05K 7/20745 | 361/679.48 |
| 2013/0138253 A1* | 5/2013 | Chainer | G05D 7/0635 | 700/282 |
| 2013/0286587 A1 | 10/2013 | Martini | | |
| 2014/0033751 A1 | 2/2014 | Bailey et al. | | |

OTHER PUBLICATIONS

Global, "Everything You Need to Know About Pallet Racks", downloaded May 21, 2014, pp. 1-3.

AK, "Pallet Rack Stocking Distributor", downloaded May 21, 2014, pp. 1-3.

International Search Report and Written Opinion for PCT/US2015/032267, Date of Mailing Sep. 2, 2015, Amazon Technologies, Inc., pp. 1-13.

* cited by examiner

US 9,357,681 B2

MODULAR DATA CENTER ROW INFRASTRUCTURE

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems. Some known data centers include methods and apparatus that facilitate waste heat removal from a plurality of racking systems, typically by circulating air through one or more of the rack systems. Where a structure includes an enclosure in which waste heat sources are located, the methods and apparatuses may be configured to facilitate waste heat removal from the waste heat sources the enclosure, or some combination thereof. For example, a data center may include methods and apparatuses may be configured to facilitate waste heat removal from a plurality of rack computing systems.

Some waste heat removal systems remove waste heat from data centers by transferring waste heat to flows of air ("exhaust air"), which are then used to transport the waste heat to an environment external to the data center. Such an environment can include an ambient environment.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), is resource-intensive and may take many months to implement. Substantial time and resources are typically required to design and build a data center (or expansion thereof), lay cables, install racks, enclosures, and cooling systems to implement waste heat removal therefrom. Additional time and resources are typically needed to conduct inspections and obtain certifications and approvals, such as for electrical and HVAC systems.

Figure 1:
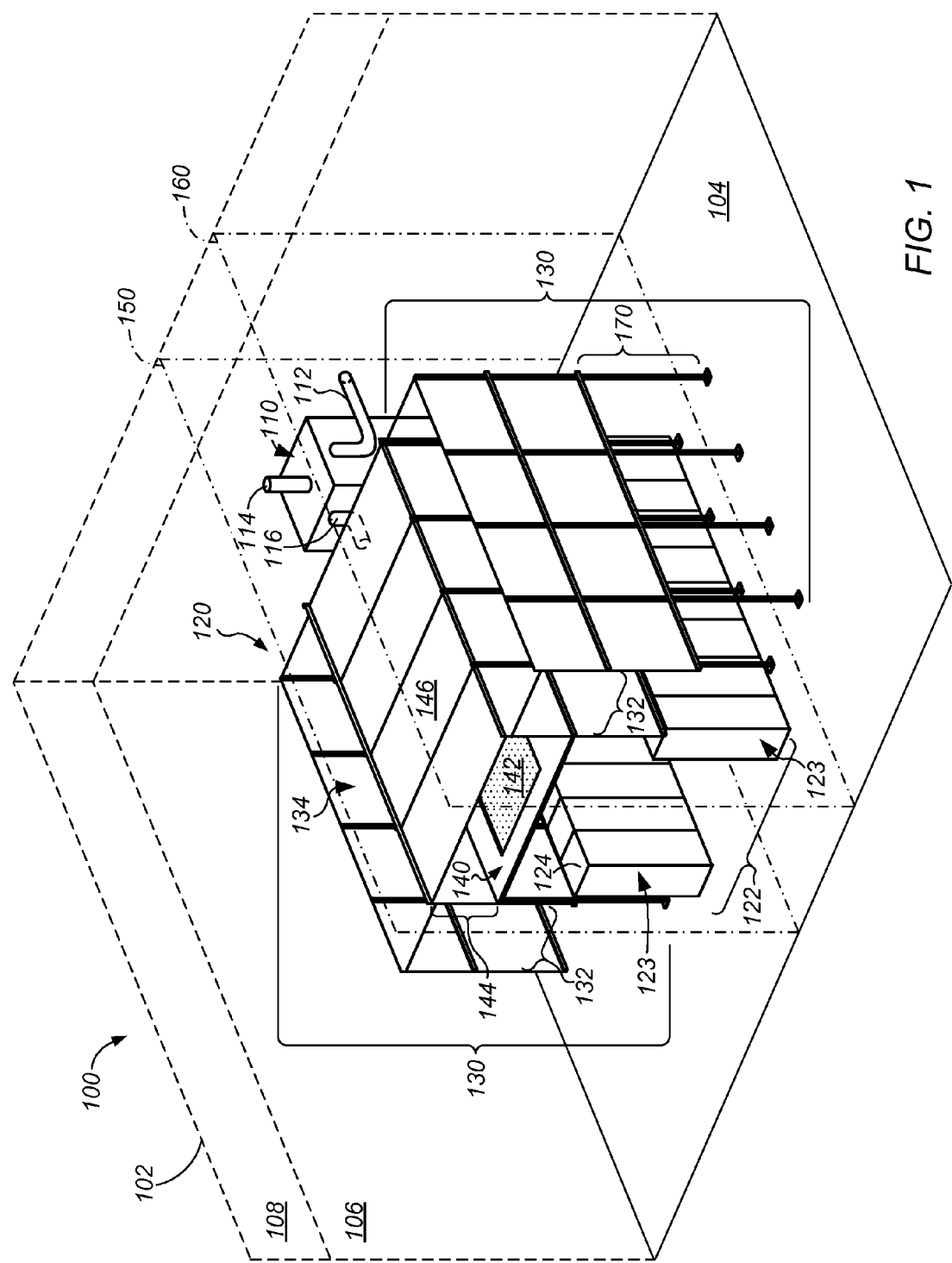
FIG. 1 is a schematic diagram illustrating a data center that includes an air handling system and one or more data center row infrastructure modules according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a modular system for a data center are disclosed. According to one embodiment, a data center includes an enclosure, which itself includes a floor element and an interior space, a data center row infrastructure module positioned in the enclosure interior space. The data center row infrastructure module can direct intake air to at least two rows of server racks and direct exhaust air away from the at least two rows of server racks and into at least a portion of the enclosure interior space. The data center row infrastructure module includes a cold aisle space, two or more free-standing exhaust plenum structures, and a plenum module. The cold aisle space has a long axis and at least two separate rows of rack computing systems. Each of the rows of rack computing systems are positioned on opposite sides of the long axis of the cold aisle, and each rack computing system can receive intake air on a front side facing the long axis of the cold aisle space and discharge exhaust air on a rear side that is opposite the front side and faces away from the long axis of the cold aisle space. Each of the free-standing exhaust plenum structures is mounted on the floor element adjacent to rear sides of separate rows of rack computing systems on opposite sides of the cold aisle space, each extending substantially in parallel with the long axis. Each of the free-standing exhaust plenum structures includes a frame structure, an internal exhaust air plenum, at least one set of wall elements, and at least one support arm structure. The frame structure includes load-bearing frame members and can establish a structural outline and structural support of the free-standing exhaust plenum structure. The internal exhaust air plenum is at least partially bounded by the at least one set of wall elements and the coupled load-bearing frame members, wherein the internal exhaust air plenum is configured to receive the exhaust air from the rear side of the set of rack computer systems and direct the exhaust air into an exhaust air plenum of the enclosure. The set of wall elements are coupled to the frame members and substantially encompass at least a portion of an aisle-facing side of the free-standing exhaust plenum structure that faces the cold aisle space. The set of wall elements can restrict airflow into the internal exhaust air plenum from the cold aisle space to exhaust air discharged from the rear sides of the adjacent row of rack computer systems. The support arm structure extends from the aisle-facing side of the free-standing exhaust plenum structure. The plenum module spans the cold aisle space between the at least two free-standing exhaust plenum structures, and rests upon an upper surface of support arm structures of each of the free-standing exhaust plenum structures, to establish a lower boundary of a cooling air plenum above the plenum module and an upper boundary of the cold aisle space beneath the plenum module and between the at least two free-standing frame structures. The plenum module includes a structural element, that substantially seals the cooling air plenum and the cold aisle space, and an intake air supply vent, extending through the structural element between the cooling air plenum and the cold aisle space, that directs at least a portion of cooling air circulating through the cooling air plenum into the cold aisle space to be supplied to the at least two rows of rack computing systems as intake air.

According to one embodiment, a data center row infrastructure module includes at least two free-standing exhaust plenum structures encompassing opposite side ends of an enclosure and a plenum module. Each free-standing exhaust plenum structure includes an internal exhaust air plenum at least partially encompassed by wall elements. The internal exhaust air plenum can receive exhaust air from the enclosure and direct the received exhaust air through an exhaust air outlet on a top end of the free-standing exhaust plenum structure. The plenum module spans a top end of the enclosure between the free-standing exhaust plenum structures, and rests upon at least one support structure of each of the exhaust plenum structures, to establish a bottom end of a cooling air plenum above and separate from the enclosure and between the free-standing exhaust plenum structures. The plenum module includes an intake air supply vent that can supply intake air from the cooling air plenum to the enclosure.

According to one embodiment, a method includes mounting free-standing exhaust plenum structures adjacent to opposite ends of a portion of a floor element and mounting a plenum module on separate support structures to establish a top end of an enclosure on a lower surface of the plenum module and to establish a bottom end of a cooling air plenum on an upper surface of the plenum module. Each of the free-standing exhaust plenum structures encompasses a separate internal air plenum and extends substantially in parallel with a long axis of the portion of the floor element, to establish side ends of the enclosure. Each of the separate support structures extend into the enclosure from an enclosure-facing side of a respective one of the free-standing exhaust plenum structures. The plenum module includes at least one intake air supply vent and can direct intake air from the cooling air plenum into the enclosure via the at least one intake air supply vent. Each of the free-standing exhaust plenum structures can receive exhaust air from the enclosure into the internal air plenum and direct the exhaust air out of the internal air plenum and into an external environment via an exhaust air supply vent.

As used herein, "air handling module" means a module that provides air to one or more systems or components external to the module.

As used herein, an "aisle" means a space next to one or more racks.

As used herein, "ambient" refers to a condition of outside air at the location of a system or data center. An ambient temperature may be taken, for example, at or near an intake hood of an air handling system.

As used herein, "computing" includes any operations that can be performed by a computer, such as computation, data storage, data retrieval, or communications.

As used herein, "computer room" means a room of a building in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, "mechanical cooling" means cooling of air by a process that involves doing mechanical work on at least one fluid, such as occurs in vapor-compression refrigeration systems.

As used herein, "evaporative cooling" means cooling of air by evaporation of liquid.

As used herein, "direct evaporative cooling" means cooling of air by evaporation of liquid directly into a stream of air to be cooled.

As used herein, "adiabatic system" means a system that cools by evaporation of a liquid.

As used herein, "free cooling" includes an operation in which an air handling system pulls air at least partially from an external source (such as air outside a facility) and/or a return from a computer room, and forces the air to electronic equipment without active chilling in the air-handling sub-system (e.g., fluid flow through the chiller coils in the air handling sub-system is shut off by closing a flow control valve).

As used herein, a "chimney effect" or "stack effect" refers to a flow of air through a pathway that is induced by an air density difference between the ends of the pathway. Such a difference may be induced by one or more various factors, including temperature differences between the ends of the pathway, ambient pressure differences, humidity differences, and the like. For example, where a building with a warm enclosure is surrounded by a colder ambient environment, the chimney effect may refer to an induced flow of air through a pathway (e.g., a chimney) between the enclosure and the environment that is induced by an air-density difference between the lower-density warmer air of the enclosure passing through the pathway to the environment while being displaced by the higher-density colder air from the environment.

As used herein, "room" means a room or a space of a structure. A "computer room" means a room in which computer systems, such as rack-mounted servers, are operated.

As used herein, a "damper" includes any device or component that can be moved to control (e.g., increase or decrease) the flow of fluid through a duct, conduit, or other passageway. Examples of dampers include plates, blades, panels, or discs, or any combination thereof. A damper may include multiple elements. For example, a damper may include a series of plates in parallel relation to one another that can be simultaneously rotated to close a duct. As used herein, to "adjust" a damper means to place or leave one or more elements of the damper to achieve desired flow characteristics through the damper, such as open, closed, or partially open. For example, in a system with eighteen passive cooling systems, adjusting the exhaust air dampers may include opening at least some selected exhaust air dampers in eight of the passive cooling systems and keeping at least some exhaust air dampers closed in the other ten passive cooling systems.

As used herein, a "space" means a space, area or volume.

As used herein, a "module" is a component or a combination of components physically coupled to one another. A module may include functional elements and systems, such as computer systems, racks, blowers, ducts, power distribution units, fire suppression systems, and control systems, as well as structural elements, such a frame, housing, structure, container, etc. In some embodiments, a module is pre-fabricated at a location off-site from a data center.

FIG. 1 is a schematic diagram illustrating a data center 100 that includes an air handling system and one or more data center row infrastructure modules according to some embodiments. Planes 150 and 160 represent cross sectional views of various elements included in data center 100, illustrated and discussed further below with reference to FIGS. 2A-B.

In some embodiments, a data center includes one or more computer rooms including computing systems and one or more cooling systems that remove waste heat energy from the computing systems. For example, in the illustrated embodiment, data center 100 includes a room 102 that encloses an interior enclosure space 106, also referred to interchangeably hereinafter as an "interior space", and a floor element 104. The data center 100 may, in some embodiments, include an exhaust plenum 108 that can receive exhaust air from various heat producing components and direct the exhaust air to at least one external environment, including an ambient environment.

Data center 100 includes an air handling system 110. The air handling system 110 delivers air to one or more portions of the interior enclosure space 106 via one or more outlet conduits 116. In some embodiments, the air handling system 110 includes one or more air moving devices that supply air as cooling air via one or more conduits 116. The air handling system may include one or more air cooling systems, including one or more mechanical cooling systems, evaporative cooling systems, etc. that chill at least some of the air supplied as cooling air. In some embodiments, the air handling system supplies at least some of the cooling air via ambient air received from an ambient environment via an intake conduit 112. The air received via the intake conduit into the air handling system 110 may be chilled and supplied as at least a portion of the cooling air. In some embodiments, ambient air received from an ambient environment is directed to conduit 116 independent of chilling of the ambient air.

In some embodiments, air handling system 110 receives at least a portion of exhaust air that is circulating through at least a portion of the exhaust plenum 108 as recirculated air. Recirculated air can be directed to air handling system 110, from plenum 108, via one or more conduits 114. The recirculated air may be mixed, at the air handling system 110, with at least some chilled air, which can include ambient air received through conduit 112, to provide a mixed air that is supplied as the cooling air via one or more outlet conduits 116. One or more of the mixing proportions of ambient air, recirculated exhaust air and chilling of at least some air included in the mixed air may be based at least in part upon one or more target characteristics of the cooling air supplied via conduits 116. For example, the flow rate of exhaust air through conduit 114 that is mixed with ambient air received via conduit 112 into cooling air supplied via conduit 116 may be controlled, via adjustable controlling of one or more dampers, air moving devices, etc. to maintain one or more characteristics of the cooling air, including temperature, wet bulb temperature, relative humidity, etc. within one or more predetermined ranges of values.

Data center 100 includes a data center row infrastructure module 120. The data center row infrastructure module at least partially encloses an enclosure space 122 in which one or more computer systems of the data center are installed in one or more rows 123 of racks 124. The enclosure space 122 can include a "cold aisle" space through which intake air is circulated to be provided to the computer systems in separate rows 123 of racks 124 in the enclosure space 122 to remove heat from one or more heat producing components of the computer systems in the racks 124.

In some embodiments, the data center row infrastructure module 120 comprises multiple separate modular elements that are installed in the interior enclosure space 106 of data center 100 to establish and bound at least a portion of enclosure space 122, and computer systems installed in racks 124 located therein. The modular elements may include free-standing exhaust plenum structural modules (also referred to interchangeably hereinafter as "free-standing exhaust plenum structures"), plenum modules, electrical modules, and air handling modules. Each module or portion of a module may be transported separately, such as on a semi-trailer. In some embodiments, modules, or portions of modules, are pre-fabricated at one location, such as a factory, and transported to a data center site at another location. In certain embodiments, however, all or some portions of the modules may be assembled at the data center 100 site. For example, one or more free-standing exhaust plenum structures 130 and plenum modules 140 may be installed in interior enclosure space 106, racks 124 may be installed in an enclosure space 122 bounded at least partially by modules 130, 140. Cooling systems, including air moving devices, air cooling systems, etc., may be installed in an air handling system 110, which may be comprised in one or more modules. In some embodiments, the modules are pre-certified prior to shipment of the modules to the site.

The data center row infrastructure module 120 can, in some embodiments, at least partially bound an enclosure space 122 into which racks 124 of computer systems may be installed in one or more rows 123 of racks 124, where one or more elements of the data center row infrastructure module 120 can circulate intake air into the enclosure space 122 to remove heat from one or more heat producing components of one or more devices, including one or more computer systems, installed in the enclosure space 122. One or more elements of the data center row infrastructure module 120 can remove air that has removed heat from at least one of the heat producing components, such air referred to hereinafter as "exhaust air", from the enclosure space 122. As a result, waste heat can be removed from the computer systems located in the enclosure space 122.

Data center row infrastructure module 120 includes free-standing exhaust plenum structures 130. Free-standing exhaust plenum structures 130 can include one or more frame members that establish an interior enclosure of the structure 130, and one or more wall elements can at least partially enclose the interior space of the structure to establish an internal exhaust air plenum 132. As shown in the illustrated embodiment, free-standing exhaust plenum structures 130 can be positioned in the interior space 106 on one or more sides of the enclosure space 122 to establish one or more side ends of the enclosure space. In some embodiments, a free-standing exhaust plenum structure 130 can be mounted adjacent to a side of the enclosure space 122 so that a rear end of one or more racks of computer systems 124 in the enclosure space 122 abuts a face of the free-standing exhaust plenum structure 130. The face of the free-standing exhaust plenum structure 130 abutting the rear end of the rack 124 can include a gap 170 through which exhaust air from the rack 124 computer systems can be received into the internal exhaust air plenum 132. In some embodiments, one or more portions of the gap can be enclosed by a removable panel (not shown in FIG. 1) to at least partially inhibit airflow of exhaust air into the internal exhaust air plenum 132. Exhaust air received into the plenum 132 can be directed out of the data center row infrastructure module 120 via one or more exhaust vents 134 on one or more sides of the free-standing exhaust plenum structure 130.

In some embodiments, including the illustrated embodiment, the exhaust vents 134 include a top end of the free-standing exhaust plenum structure 130 that is unencompassed by wall elements, such that the top end is open to at least the interior space 106, the plenum 108, etc. Exhaust air in the plenum 132 can be directed out of the vent 134 via one or more gradients between the plenum 132 and at least the interior space 106, including a chimney effect gradient, a pressure gradient, some combination thereof, or the like. In some embodiments, where data center 100 includes an interior space exhaust plenum 108, exhaust air can be directed out of the plenums 132 into the exhaust plenum 108 via one or more gradients between plenums 132 and plenum 108. Exhaust air directed out of module 120 and into exhaust plenum 108 can be directed out of the room 102, recirculated at least partially back to an air handling system 110 via a recirculation conduit 114, some combination thereof, or the like.

Data center row infrastructure module 120 includes one or more plenum modules 140 that are installed to establish a top end of the enclosure space 122 and at least a portion of a cooling air plenum 144 that is separate from the enclosure space 122. The plenum module 140, in some embodiments, comprises one or more elements that are mounted on separate support elements of separate free-standing exhaust plenum structures 130, themselves mounted on opposite sides of an enclosure space 122, where the plenum module 140 spans at least a portion of the space between the opposite free-standing exhaust plenum structures 130 and establishes at least a top end of the enclosure space 122 and a bottom end of the cooling air plenum 144. In some embodiments, a plenum module 140 is mounted on support arm structures of the opposite free-standing exhaust plenum structures 130, where the support arm structures provide structural support to the plenum module.

In some embodiments, the cooling air plenum 144 is established based at least in part upon the various modular elements of the data center row infrastructure module 120. As shown, some embodiments of a cooling air plenum 144 are established based at least in part of one or more free-standing exhaust plenum structures 130 and plenum modules 140. Side ends of the cooling air plenum 144 may be established based at least in part upon faces of free-standing exhaust plenum structures 130 mounted on opposite sides of the enclosure space 122, and a bottom end of the cooling air plenum 144 may be established based at least in part upon one or more surfaces of the plenum module 140, which can include an upper surface of a plenum module 140 element, where the lower surface of the plenum module element establishes the top end of the enclosure space 122 and the plenum module element includes vent 142.

In some embodiments, row infrastructure module 120 includes one or more plenum ducts 146 that can be mounted on free-standing exhaust plenum structures 130, the structures 130 themselves being mounted on opposite sides of enclosure space 122, to establish a top end of the cooling air plenum 144 via a lower surface of the plenum duct 146. The plenum duct 146 can be mounted on support elements of the separate free-standing exhaust plenum structures 130, where the support elements provide structural support to the plenum duct 146 and transmit the structural load of the plenum duct through at least a portion of the free-standing exhaust plenum structures. A plenum duct, in some embodiments, is mounted to enclose top and side portions of the cooling air plenum 144.

In some embodiments, one or more of the free-standing exhaust plenum structures 130 includes one or more support elements that include one or more support arm structures. A support arm structure may be coupled to one or more frame members of a free-standing exhaust plenum structure. In some embodiments, a support arm structure can structurally support one or more elements mounted on the support arm structure. For example, the support arm structure can transmit a structural load of an element mounted on the support arm structure through at least a portion of the free-standing exhaust plenum structure. In some embodiments, a support arm structure extends away from a face of the free-standing exhaust plenum structure. For example, where one or more free-standing exhaust plenum structures 130 are mounted on a floor element 104 of an interior space 106 on opposite sides of an enclosure space 122, one or more of the free-standing exhaust plenum structures 130 can include at least one support arm structure that extends away from a face of the free-standing exhaust plenum structure 130 that faces the enclosure space 122 and into at least a portion of the enclosure space 122.

The plenum module 140 includes one or more vents 142 that direct cooling air circulating through at least a portion of the cooling air plenum 144 into the enclosure space 122 as intake air, so that air is provided to computer systems in racks 124 in the enclosure space 122 to remove waste heat from the computer systems. In some embodiments, the plenum module 140 is mounted on separate support arm structures of each of at least two free-standing exhaust plenum structures 130 on opposite sides of an enclosure space 122, so that the plenum 140 rests upon the support arm structures and transfers structural loads to the free-standing exhaust plenum structures 130 via the support arm structures.

In some embodiments, one or more of the modular elements comprised in the data center row infrastructure module 120 is comprised of components that can be utilized for shelving systems. For example, the frame members of a free-standing exhaust plenum structure 130 can be comprised of a free-standing pallet shelving structure. A free-standing pallet shelving rack, as utilized for storing and stacking pallets, may include multiple lateral bracing members through the interior of the structure to provide shelves to support the pallets. The free-standing exhaust plenum structure 130, in some embodiments, includes a free-standing pallet shelving rack where multiple lateral bracing members are removed to open up the interior of the structure to comprise the internal exhaust air plenum, and one or more wall elements are coupled to one or more faces of the structure to at least partially encompass the internal exhaust air plenum, etc. In another example, one or more support arm structures of a free-standing exhaust plenum structure may comprise support arms of a drive-through pallet shelving system. A drive-through pallet shelving system, as utilized for storing and stacking pallets, may include multiple particularly-spaced vertical posts, which may not comprise free-standing structures, that are bolted to a floor element and each include one or more support arm structures that extend into a space between the posts, where a pallet can be moved into the spaces and lifted to rest upon multiple support arm structures extending from multiple posts into a common space. In a drive-through pallet shelving system, the pallets may be moved and lifted by a forklift vehicle. The free-standing exhaust plenum structure 130, in some embodiments, includes one or more support arm structures of a drive-through pallet shelving system that are coupled to frame members of the free-standing exhaust plenum structure. In some embodiments, at least a portion of a free-standing exhaust plenum structure 130 can be assembled via coupling of selected elements of the separate shelving systems, including the frame members and support arm structures.

In some embodiments, one or more of the free-standing exhaust plenum structures 130, plenum modules 140, plenum ducts 146, etc. can be installed in an interior space 106 to rapidly establish a data center row infrastructure module bounding at least a portion of an enclosure space 122, also referred to hereinafter as a "bounded enclosure", for which the modular elements provide air circulation through the bounded enclosure 122 for heat producing components, including rack computer systems, located in the bounded enclosure 122. The data center row infrastructure module 120 can be increased and decreased in size through addition and removal, respectively, of free-standing exhaust plenum structures 130, plenum modules 140, etc. to lengthen or shorten the bounded enclosure 122 for which air circulation is provided via the assembled data center row infrastructure module 120.

In some embodiments, a bounded enclosure 122 includes one or more rows 123 of racks 124 that extend substantially in parallel with one or more faces of one or more free-standing exhaust plenum structures extending along one or more sides of the bounded enclosure 122. Where free-standing exhaust plenum structures 130 are mounted on opposite sides of an enclosure space 122, one or more rows of racks 124 may be mounted in the enclosure space 122 to extend along one or more faces of the free-standing exhaust plenum structures that face the enclosure space.

In some embodiments, free-standing exhaust plenum structures 130 are mounted on opposite sides of an enclosure space 122 and extend substantially in parallel with an axis of the enclosure space. The axis can include a long axis of the space 122, a short axis of the space 122, etc. The rows may be installed in the enclosure space 122 substantially in parallel with free-standing exhaust plenum structures and substantially in parallel with the axis that the structures are also extending in parallel with. In the illustrated embodiment, for example, enclosure space 122 includes a long axis, and free standing structures 130 are extending along opposite sides of the enclosure space 122 substantially in parallel with the long axis of the space 122. Furthermore, the space 122 includes two separate rows 123 of racks 124, where each row 123 of racks 124 extends substantially in parallel with the long axis of the room, and each row of racks is installed to abut the rear ends of the racks in a given row against a face of one or more sets of free-standing exhaust plenum structures 130 on a given side of the enclosure space 122. As a result, the enclosure space 122 ("bounded enclosure") is bounded on side ends that are substantially parallel to a long axis of the space 122 by opposite-facing sets of free-standing exhaust plenum structures 130 and the space 122 includes two opposite-facing rows 123 of racks 124, where the front ends of each row 123 of racks 124 faces into the space 122, towards the long axis and the opposite row 123 of racks 124, and the rear ends of a given row of racks abuts a face an adjacent set of free-standing exhaust plenum structures 130 that faces into the space 122.

The number of modular elements, including free-standing exhaust plenum structures 130, plenum modules 140, etc., deployed in a data center row infrastructure module 120 may be selected based on the requirements of the data center 100. For example, if a data center in Facility A needs 38 server racks, Facility A may be provided with eight free-standing exhaust plenum structures 130 and four plenum modules 140, where the eight free-standing exhaust plenum structures can be installed on opposite sides of a space 122, and the plenum modules 140 can be mounted to span between opposite free-standing exhaust plenum structures 130, to establish a bounded enclosure 122 that is of sufficient size and air circulation capability to accommodate 38 server racks in Facility A. In addition, over time, modular elements can be added to a data center row infrastructure module 120 at a data center if the computing capacity needed at the facility increases, and modules can be removed from a data center row infrastructure module 120 at a data center and redeployed if the computing capacity needed at the facility decreases.

Figure 2A:
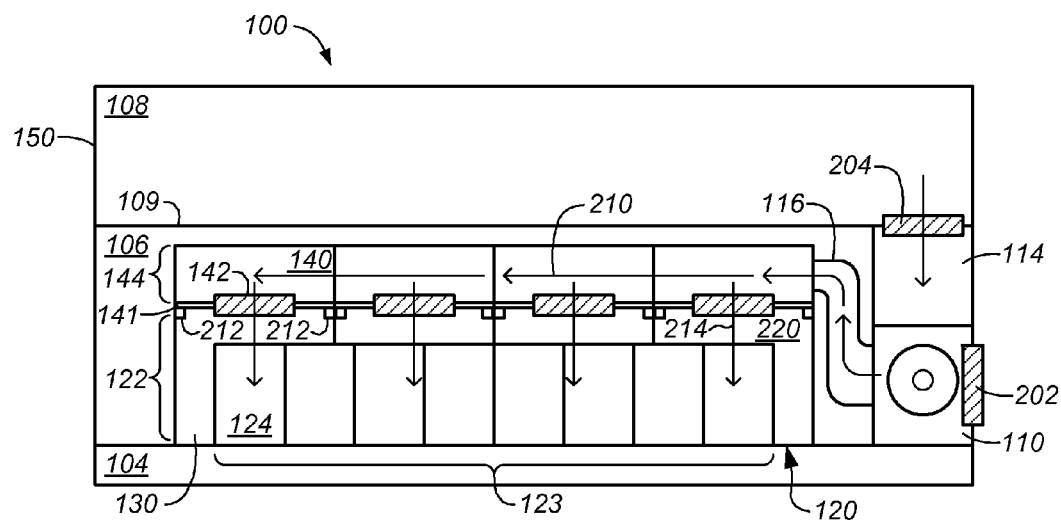
FIG. 2A-B are schematic diagrams illustrating cross sectional views of one or more data center row infrastructure modules according to some embodiments.
Figure 2B:
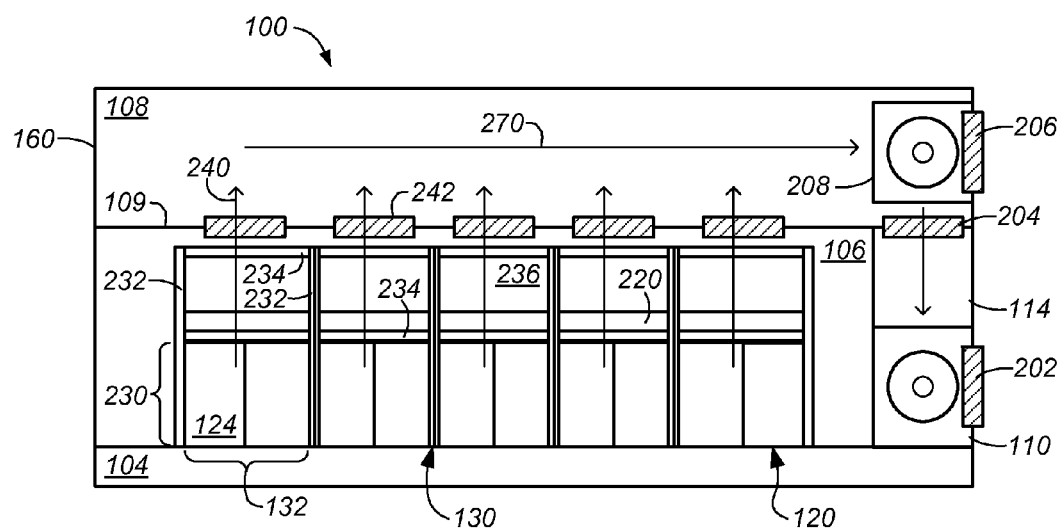

FIG. 2A-B are schematic diagrams illustrating cross sectional views of one or more data center row infrastructure modules according to some embodiments.

FIG. 2A illustrates a cross-sectional view 150 of data center 100 that includes a cross section of data center row infrastructure module 120 through the enclosure space 122, as indicated in FIG. 1. The illustrated cross-sectional view illustrates the elements included in the enclosure space 122 and cooling air plenum 144 of the row infrastructure module 120, the one or more rows 123 of racks 124 installed in the enclosure space, and directing of air to the enclosure space 122 to provide intake air to computer systems mounted in the racks 124.

As discussed above with reference to FIG. 1, data center 100 can include an air handling system, illustrated in FIG. 2A as system 110, which can direct air to the cooling air plenum 144 of a data center row infrastructure module 120 via one or more outlet conduits 116 extending from an outlet of the air handling system 110. The air handling system 110 may include an air moving device that supplies the air via the conduit 116. In some embodiments, the air handling system 110 supplies air that includes air from separate sources. For example, air handling system 110 may receive air from an external environment, including an ambient environment, via one or more supply vents 202. At least some received air may be cooled via operation of one or more various air cooling systems that may be included in the air handling system 100, including mechanical cooling systems, evaporative cooling systems, adiabatic cooling systems, free-cooling systems, some combination thereof, or the like.

In some embodiments, at least some exhaust air can be received at air handling system 110 and mixed with air from other sources to provide a mixed air that is provided to row infrastructure modules 120 via one or more conduits 116. For example, at least some exhaust air circulating in an interior space exhaust plenum 108 may be directed to air handling system 110 via one or more vents 204, recirculation conduits, etc.

One or more of the mixing proportions of ambient air, recirculated exhaust air and chilling of at least some air included in the mixed air may be based at least in part upon one or more target characteristics of the cooling air supplied via conduits 116. For example, the flow rate of exhaust air through conduit 114 that is mixed with ambient air received via at least vent 202 into cooling air supplied via conduit 116 may be controlled, via adjustable controlling of one or more dampers, air moving devices, etc. to maintain one or more characteristics of the cooling air, including temperature, wet bulb temperature, relative humidity, etc. within one or more predetermined ranges of values.

As shown in FIG. 2A, cooling air 210 received into the cooling air plenum 144 of the data center row infrastructure module is directed through at least a portion of the plenum 144. As shown, the plenum 144 can be established based at least in part upon one or more plenum modules 140. In the illustrated embodiment, for example, module 120 includes four plenum modules 140 that each establish at least side and bottom ends of the plenum 144. Each plenum module 140 includes a bottom portion 141 that separates the plenum 144 from the bounded enclosure 122 and establishes at least a bottom end of a portion of the plenum 144, in addition to establishing a top end of a portion of the bounded enclosure 122. In some embodiments, one or more of the plenum modules 140 in module 120 includes one or more vents 142 that can direct at least a portion of the cooling air 210 that is being directed through the plenum 144 from the outlet of conduit 116 into at least a portion of the bounded enclosure 122. Air directed into the bounded enclosure 122 is referred to hereinafter as "intake air". As shown, portions of cooling air passing through the plenum 144 can be directed, by respective vents 142, out of the plenum 144 and into the bounded enclosure 122 as intake air 214. The intake air 214 may be directed into the enclosure via one or more of a pressure gradient from the plenum 144 to at least the bounded enclosure 122 across the vents 142, an air density gradient, some combination thereof, or the like. In some embodiments, one or more vents 142 include an air moving device that operates to supply air from the plenum 144 into the bounded enclosure 122.

In some embodiments, and as shown in the illustrated embodiment, one or more of the plenum modules 140 may be mounted on one or more support arm structures 212. The support arm structures may be included in one or more free-standing exhaust plenum structures 130. In the illustrated embodiment, each free-standing exhaust plenum structure 130 includes two support arm structures 212 extending from the face of the structure 130 that faces the bounded enclosure 122, and each plenum module 140 is mounted on at least the two support arm structures 212 of a give free-standing exhaust plenum structure, so that the plenum module rests at least in part upon an upper surface of the support arm structures 212 and transmits at least a portion of its structural load to the free-standing exhaust plenum structure 130 via the support arm structures 212 upon which it rests.

As shown, intake air 214 may drop from plenum 144 into enclosure space 122 via vents 142. The enclosure space includes one or more rows 123 of racks 124, the rear ends of the illustrated row 123 of racks abutting the faces of the illustrated free-standing exhaust plenum structures 130 that face into the space 122. The intake air 214 may be received into computer systems (not shown) installed in one or more of the racks 124. The faces of the free-standing exhaust plenum structures 130 facing into the enclosure space 122 include one or more wall elements 220 that substantially enclose one or more interior portions of the free-standing exhaust plenum structures 130, including one or more internal exhaust air plenums, and partition the interior portions from the enclosure space 122 to preclude air moving from the interior portions of the free-standing exhaust plenum structures 130 directly into the enclosure space 130 via the faces of the structures 130 that face into the enclosure space 130. For example, the exhaust air plenums in the interior of the free-standing exhaust plenum structures 130 may be at a higher air pressure than the air pressure of the enclosure space, and the wall elements 200 may preclude exhaust air from passing directly back into the enclosure space 122. In some embodiments, where the rear ends of racks 124 abut the faces of the free-standing exhaust plenum structures 130 facing into the enclosure space 122, the rear ends of one or more of the racks 124 may abut one or more gaps 230 in the faces of the free-standing exhaust plenum structures 130 facing into the enclosure space 122, so that exhaust air discharged from computer systems installed in the racks, via the rear ends of the racks 124, can pass into the interior of one or more of the free-standing exhaust plenum structures. Sealing elements, including one or more gasket components, may be mounted at interfaces between the racks 124 and the wall elements 220 to at least partially mitigate leakage of exhaust air into the enclosure space 122.

FIG. 2B illustrates a cross-sectional view 160 of data center 100 that includes a cross section of data center row infrastructure module 120 through the exhaust air plenums 132 of at least one set of free-standing exhaust plenum structures 130 mounted on one side of the enclosure space 122, as indicated in FIG. 1. The illustrated cross-sectional view illustrates at least some elements included in the free-standing exhaust plenum structures 130 of the row infrastructure module 120, the interior exhaust plenum 108 included in the interior space 106 external to the data center row infrastructure module 120, and the flow of exhaust air through the plenums 132, out of the module 120, and through at least a portion of the exhaust plenum 108 of the data center 100.

As shown in FIG. 2B, exhaust air 240 can be received into the internal exhaust air plenums 132 of one or more free-standing exhaust plenum structures 130. The exhaust air can be received into the plenums 132 via one or more gaps 230 in the wall elements 220 facing the rear ends of one or more of the racks 124, as discussed above. Exhaust air 240 received into the plenums 132 may be directed out of the free-standing exhaust plenum structures 130, and out of the row infrastructure module 120, via one or more exhaust vents of the free-standing exhaust plenum structures, which can include, as shown in FIG. 2B, unencompassed top ends of the free-standing exhaust plenum structures. In some embodiments, exhaust vents of a free-standing exhaust plenum structure can include one or more air moving devices that operate to remove exhaust air from the plenum 132 of the structure 130.

Free-standing exhaust plenum structures 130 can include one or more frame members 232, 234 that establish an interior enclosure of the structure 130, and one or more wall elements 220, 236 can at least partially enclose the interior space of the structure 130 to establish an internal exhaust air plenum 132. The one or more frame members 232, 234 can be coupled to establish a free-standing frame that collectively encompasses an interior space and define an outline of the free-standing exhaust plenum structure 130. Where the frame includes multiple frame members, the members may be coupled together via one or more known coupling methods, including bolting, welding, riveting, etc. One or more frame members may include post members 232 that extend vertically through the structure and can transmit at least some of the structural load of the structure to a floor element. One or more frame members may include bracing members 234 that provide at least some lateral structural support to the structure.

In some embodiments, a free-standing exhaust plenum structure 130 includes one or more wall elements 220, 236 coupled to one or more frame members 232, 234 on a portion of one or more faces of the free-standing exhaust plenum structure. For example, wall elements 220, 236 may cover a limited portion of a face of the free-standing exhaust plenum structure 130, so that a gap 230 remains through which exhaust air 240 may be received from one or more waste heat sources into the interior exhaust air plenum 132 of the free-standing exhaust plenum structure 130. Another gap may be present in a wall element 236 coupled to an upper portion of a face of a free-standing exhaust plenum structure, so that at least some of the exhaust air circulating through the internal exhaust air plenum of the free-standing exhaust plenum structure can be redirected to another external plenum via one or more vents mounted in the gap. In some embodiments, multiple types of wall elements may be coupled to one or more faces of the free-standing exhaust plenum structure. For example, one or more wall elements 236 that include an insulating material may be coupled to an upper portion of a face of a free-standing exhaust plenum structure, so that the wall elements mitigate heat transfer from exhaust air circulating through the internal exhaust air plenum to one or more air plenums 144 external to the free-standing exhaust plenum structure, and one or more wall elements 220 that are substantially free from insulating materials may be coupled to a lower portion of the same face of the free-standing exhaust plenum structure that faces the enclosure space 122.

In some embodiments, exhaust air 240 can be directed out of the plenum 132 of one or more free-standing exhaust plenum structures 130 to exit the row infrastructure module 120. The exhaust air exiting a module may pass into an exhaust plenum 108 of the data center 108. In some embodiments, the plenum 108 includes an upper portion of the interior space 106 of the data center. In some embodiments, the plenum 108 is a separate enclosure bounded on a lower end by a ceiling element 109 that separates the interior 106 from the plenum 108. Exhaust air 240 may pass into the plenum through ceiling element 109 via one or more vents 242, which may include one or more adjustable dampers that can be controlled to adjust the flow rate of exhaust air into the plenum 108.

In some embodiments, the plenum 108 can include an air handling system 208, which can include one or more air moving devices, which can move at least some of the exhaust air out of the plenum 108 and to an external environment, including an ambient environment, via one or more vents 206. In some embodiments, at least some of the exhaust air 270 in plenum 108 can be recirculated, via one or more vents 204, recirculation conduits 114, etc. to one or more air handling systems 110 to be mixed with other air, including ambient air, chilled air, etc. to be provided back to one or more row infrastructure modules 120 as cooling air.

Figure 3:
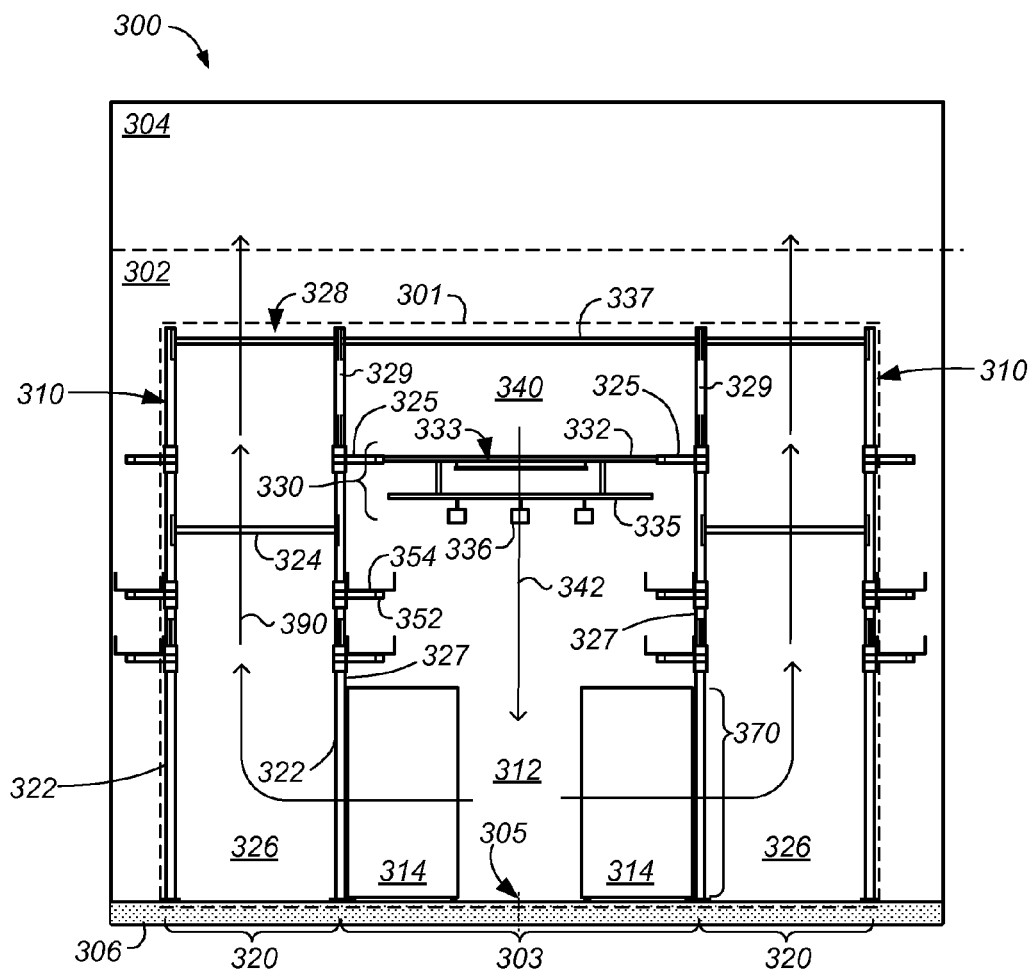
FIG. 3 is a cross sectional view of a portion of a data center row infrastructure module according to some embodiments.

FIG. 3 is a cross sectional view of a portion of a data center row infrastructure module according to some embodiments. Data center 300 includes an enclosure that comprises an interior enclosure space 302, a floor element 306, and an upper portion of the interior enclosure space 302 that includes an interior enclosure space exhaust plenum 304. The exhaust plenum 304 can receive exhaust air 390 discharged from various components, modules, etc. mounted in the internal enclosure space 302.

Data center 300 includes data center row infrastructure module 301. The data center row infrastructure module 301 is mounted in the interior enclosure space 302 on at least a portion of floor element 306.

Data center row infrastructure module 301, also referred to hereinafter as "module 301", includes an enclosure space 312 that is at least partially bounded by various modular elements of module 301, including at least the illustrated structures 310 and module 330. The enclosure space 312 may hereinafter be referred to as a "bounded enclosure 312". The bounded enclosure 312, in some embodiments, includes one or more heat producing components, including racks 314 into which computer systems (not shown) are installed, where the computer systems include one or more heat producing components. The computer systems may require cooling air to remove heat from the heat producing components therein, thereby removing heat from the computer systems and mitigating the risk of damage to sensitive components from overheating. The computer systems may require various infrastructure elements for normal operation, including power distribution infrastructure, communication infrastructure, etc.

In some embodiments, module 301 is configured to provide air to the bounded enclosure 312 to remove heat from one or more heat producing components mounted in the bounded enclosure 312. In some embodiments, a bounded enclosure that receives air for such heat removal is referred to as a "cold aisle", "cold aisle space", etc. The bounded enclosure may include a length of floor space (e.g., an "aisle") on which various components, including racks 314, are mounted. The racks 314 may be mounted in one or more rows in various portions of the bounded enclosure 312. As shown, the racks 314 may be mounted on opposite sides of the bounded enclosure 312. In some embodiments, the racks 314 are mounted to position front ends of the respective racks 314 into the bounded enclosure 312 and the rear ends of the respective racks 314 away from the bounded enclosure 312. In some embodiments, devices mounted in the racks 314 are configured to receive intake air 342 for heat removal via the front end of the rack and discharge exhaust air that has removed at least some heat from one or more heat producing components of the device via the rear end of the rack. Thus, intake air can be received from the interior of the bounded enclosure 312 into the racks, and exhaust air can be discharged out of the bounded enclosure 312.

In some embodiments, the number of modular elements, including free-standing exhaust plenum structures 310, plenum modules 330, etc., deployed in a data center row infrastructure module 301 may be selected based on the requirements of the data center 300. For example, if a data center in Facility A needs 38 server racks, Facility A may be provided with eight free-standing exhaust plenum structures 310 and four plenum modules 330, where the eight free-standing exhaust plenum structures can be installed on opposite sides of a space, and the plenum modules can be mounted to span between opposite free-standing exhaust plenum structures, to establish a bounded enclosure 312 that is of sufficient size and air circulation capability to accommodate 38 server racks 314 in Facility A. In addition, over time, modular elements can be added to a data center row infrastructure module 301 at a data center 300 if the computing capacity needed at the facility increases, and modules can be removed from a data center row infrastructure module 301 at a data center 300 and redeployed if the computing capacity needed at the facility decreases.

In some embodiments, at least some of the bounded enclosure 312 is established by one or more modular elements of module 301. For example, as illustrated, where at least two free-standing exhaust plenum structures 310 are mounted in the interior space 302 of data center 300 on floor element 306, the free-standing exhaust plenum structures 310 can be mounted on the floor 306 to establish side ends of the bounded enclosure. The structures 310 can be mounted in a spaced configuration, where the structures are mounted on opposite sides of a space 303 of the floor element. As illustrated above with reference to FIG. 1, module 301 may comprise at least two sets of multiple structures 310 that each extend along opposite sides of a space 303. Where multiple structures 310 are coupled together on each of the opposite sides of the space 303 to establish respective sets of structures 310, the two or more sets of structures 310 may extend substantially in parallel with a particular axis 305 of the space 303. For example, where space 303 includes a substantially rectangular portion of the floor element 306, where the illustration of space 303 in FIG. 3 is a width of the space that is less than a perpendicular length of the space (not shown), the axis 305 extending along the length of the space may comprise a long axis of the space, so that the structures 310 mounted on opposite ends of the space extend substantially in parallel with the long axis 305 to establish side ends of the space 303. In some embodiments, establishing side ends of space 303 includes at least partially establishing side ends of the bounded enclosure 312.

In some embodiments, a top end of the bounded enclosure 312 is at least partially established by a plenum module 330. As shown, a plenum module 330 is mounted in the interior enclosure space 302 to rest upon at least a portion of separate support arm structures 325 of the separate free-standing exhaust plenum structures 310 mounted on opposite sides of space 303. The module 330 may comprise a panel element 332, a vent 333, etc. The panel element 332 may include a lower surface and an upper surface that restricts airflow between the surfaces beyond the vent 333. As a result, in some embodiments, a plenum module 330 can be coupled to separate free-standing exhaust plenum structures 310 that are themselves mounted on opposite side ends of space 303 to establish a top end of bounded enclosure 312 and a bottom end of another enclosure that can include a cooling air plenum 340. Coupling a plenum module 330 to a free-standing exhaust plenum structure 310 can including mounting the plenum module 330 on one or more support art structures 325 of the structure 310, where the plenum module 300 may rest upon one or more surfaces, including an upper surface, of the support arm structure and transmit at least apportion of the plenum modules 330 structural load to at least a portion of the structure 310 via support arm structure 325.

In some embodiments, module 301 includes various plenums that direct air to bounded enclosure 312 to provide intake air to the bounded enclosure, direct air from the bounded enclosure 312 to remove exhaust air from the bounded enclosure, some combination thereof, or the like. In the illustrated embodiments, a plenum duct 337 can be coupled to the separate free-standing exhaust plenum structures 310 to establish a top end of an enclosure, which can include a cooling air plenum 340, from which air can be directed into the bounded enclosure 312 as intake air 342. As shown, at least some ends of the cooling air plenum 340 can be established by the plenum module 330, free-standing exhaust plenum structures 310, plenum duct 337, etc. In some embodiments, where the plenum module 330 includes an enclosure structure that establishes top ends, bottom ends, and side ends of the plenum 340, a plenum duct 337 may be omitted from module 301. In the illustrated embodiment, cooling air plenum 340 is established via a lower surface of plenum duct 337, an upper surface of plenum module 330, and upper portions of the faces of the free-standing exhaust plenum structures 310 that face into space 303. Such faces are referred to hereinafter as "enclosure faces" of the respective structures 310.

In some embodiments, cooling air is received into cooling air plenum 340 and circulated through at least a portion of cooling air plenum 340. The cooling air can be directed from plenum 340 into the bounded enclosure 312 as intake air 342 via one or more vents 333. In some embodiments, one or more vents 333 include one or more dampers which may be adjustably controllable to adjustably control the flow rate of intake air into at least a portion of the bounded enclosure. In some embodiments, the cooling air is directed through the vents via one or more gradients from the plenum 340 to the enclosure 312, including a pressure gradient, air density gradient, some combination thereof, or the like.

In some embodiments, one or more of the free-standing exhaust plenum structures 310 in module 301 includes a free-standing frame comprised of one or more frame members. As shown in the illustrated embodiment, the free-standing exhaust plenum structures 310 include frame members including vertical frame post members 322 and bracing frame members 324. The frame members can provide structural support and integrity to a given structure 310 and can establish a structural outline of the structure 310. In some embodiments, the structure 310 includes an interior space 320 that comprises an internal exhaust air plenum 326. The plenum 326 can receive exhaust air from rear ends of racks 314 mounted in the bounded enclosure 312 to abut the respective enclosure face of the respective free-standing exhaust plenum structure 310. Exhaust air 390 can be received from one or more devices that include one or more heat producing components. The exhaust air 390 may comprise intake air that has passed through at least a portion of the rack 314 and removed heat from at least one of the heat producing components included in one or more devices mounted in the rack 314.

In some embodiments, a free-standing exhaust plenum structure 310 includes one or more wall elements that encompass at least a portion of one or more faces of the free-standing exhaust plenum structure. In the illustrated embodiments, at least the enclosure faces of the free-standing exhaust plenum structures 310 include wall elements 327, 329 that encompass respective portions of the enclosure faces of the structures 310. Wall element 327 can include one or more elements that encompass at least a portion of the enclosure face of the free-standing exhaust plenum structure to partition the interior of the free-standing exhaust plenum structure 310 from the bounded enclosure 312, thereby restricting flow of exhaust air from the internal exhaust air plenum 326 of the structure 310 into the bounded enclosure 312. In some embodiments, the wall element 327 extends from the portion of the free-standing exhaust plenum structure 310 at which the plenum module 330 is coupled to a portion where one or more racks 314 abut the enclosure face of the free-standing exhaust plenum structure 310. The enclosure face of the free-standing exhaust plenum structure 310 may include one or more gaps 370, including one or more gaps 370 where a rack 314 abuts the enclosure face, so that exhaust air 390 can pass from the rear end of the rack 314 into the plenum 326 of the free-standing exhaust plenum structure 310. One or more sealing elements may be coupled between a rack 314 and a wall element 327 of the proximate structure 310 to seal the interface between the wall element 327 and the structure of the rack 314 and to at least partially mitigate, prevent, etc. leakage of exhaust air from plenum 326 to bounded enclosure 312.

Wall element 329 can include one or more elements that encompass at least a portion of the enclosure face of the free-standing exhaust plenum structure 310 to partition the interior of the free-standing exhaust plenum structure 310 from at least the cooling air plenum 340, thereby at least partially restricting a flow of exhaust air from the internal exhaust air plenum 326 of the structure 310 into the cooling air plenum, thereby at least partially mitigating, preventing, etc. leakage of exhaust air 390 from plenum 326 to cooling air plenum 340 to mix with cooling air in the plenum 340. In some embodiments, the wall element 329 extends from the portion of the free-standing exhaust plenum structure 310 at which the plenum module 330 is coupled to a portion where one or more plenum ducts are coupled to the free-standing exhaust plenum structure 310. The enclosure face of the free-standing exhaust plenum structure 310 may include one or more gaps, so that at least some exhaust air can pass from the plenum 326 to mix with cooling air in plenum 340 to provide mixed air. The gaps may include one or more vents mounted in the enclosure face of the free-standing exhaust plenum structure 310, where such vents may include one or more sets of adjustably controllable dampers.

In some embodiments, a free-standing exhaust plenum structure 310 includes one or more exhaust vents 328 through which exhaust air 390 can be directed from an internal exhaust air plenum of the free-standing exhaust plenum structure 310 to an environment external to module 301. The external environment can include interior space 302, interior space exhaust plenum 304, etc. The exhaust air 390 can be directed through the vents 328 via one or more of a pressure gradient between the plenum 326 and the external environment, an air density gradient, a chimney effect, some combination thereof, or the like.

In some embodiments, one or more free-standing exhaust plenum structures 310 in module 301 include multiple enclosure faces. Each of the multiple enclosure faces can include one or more wall elements 327, 329, support arm structures 325, etc. As a result, a given free-standing exhaust plenum structure 310 can be mounted on a side of multiple spaces 303, where one face of the structure 310 faces one space 303 and another face, which may be an opposite face, faces another separate space 303. The plenum 326 of a given structure 310 may receive exhaust air from two or more separate racks 314 that are each mounted in separate bounded enclosures 312. As a result, module 301 may include multiple bounded enclosures 312 that are each at least partially bounded by one or more structures 310, modules 330, etc.

In some embodiments, module 301 includes one or more support elements that support one or more infrastructure elements. The support elements can include one or more rails, trays, busways, etc., which may be coupled to one or more various modular elements of module 301. In the illustrated embodiment, for example, plenum module 330 includes a support tray 335 and a plurality of busways 336 that can support one or more elements of infrastructure, including one or more power busses, power transmission lines, communication lines, lighting elements, sensors, etc.

In addition, the illustrated embodiment illustrates support trays 354 that are coupled to support arm structures 352 that are themselves coupled to free-standing exhaust plenum structures 310. They trays may support one or more one or more elements of infrastructure, including one or more power busses, power transmission lines, communication lines, lighting elements, sensors, etc. One or more of the infrastructure elements supported by one or more of trays 354, busways 336, tray 335, etc. may include elements that are routed through the bounded enclosure to provide at least a portion of infrastructure support to various computer systems installed in racks 314. For example, trays 354 may route power transmission lines, busses, etc. through bounded enclosure to provide power distribution support to computer systems installed in the racks 314, and busway 336 may route one or more communication lines, including network communication cables, through the bounded enclosure 312 to communicatively couple one or more computer systems installed in the racks 314 with one or more communication networks.

Figure 4:
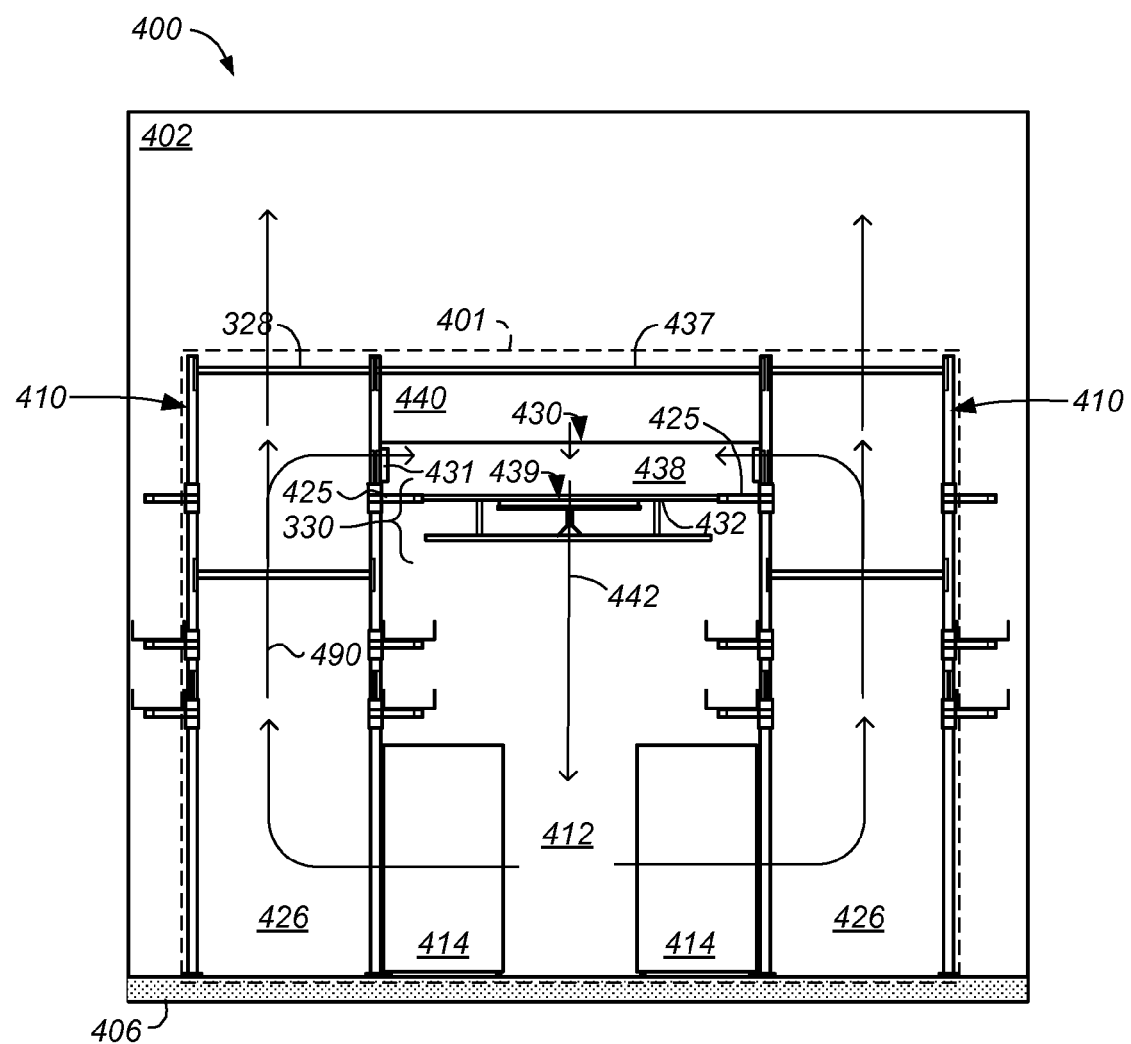
FIG. 4 is a cross sectional view of a portion of a data center row infrastructure module according to some embodiments.

FIG. 4 is a cross sectional view of a portion of a data center row infrastructure module according to some embodiments. In some embodiments, a data center row infrastructure module 401 is mounted on a floor element 406 in an interior enclosure space 402 of a data center 400. The module 401 includes free-standing exhaust plenum structures 410 and plenum modules 430 that at least partially encompass a bounded enclosure 412 in which one or more racks 414 are mounted.

In some embodiments, the plenum module 430 includes a mixing plenum 438 that can mix cooling air received from a cooling air plenum 440 with at least some exhaust air 490 from one or more internal exhaust air plenums 426 of one or more free-standing exhaust plenum structures 410. The plenum module 430, which may be coupled to the free-standing exhaust plenum structures 410 via mounting on one or more support arm structures 425, may include a panel element 432 that establishes at least the bottom end of the mixing plenum 438 and side wall elements that establish side ends of the mixing plenum 438. The top end of the mixing plenum 438 may be at least partially unencompassed by one or more structural elements of the plenum module 430, so that the top end of the mixing plenum 438 is at least partially open to an enclosure 440, which may include the cooling air plenum 440. The cooling air plenum 440 may be bounded on a top end by plenum duct 437, one or more portions of plenum module 438, some combination thereof, or the like.

Cooling air received from the cooling air plenum 440 and at least some exhaust air received from one or more plenums 426 of at least one free-standing exhaust plenum structure 410 can result in a mixed air. The mixed air can be directed into the bounded enclosure 412, via an air vent structure 431. For example, in the illustrated embodiment, plenum module 430 includes a mixing plenum 438 that is configured to mix cooling air received from a cooling air plenum 440 via the unencompassed top end of the plenum 438, and at least some recirculated exhaust air 490 from one or more plenums 426 to provide mixed air that can be supplied to a bounded enclosure 412 as intake air 442 through the panel 432 via a vent structure 439 in the panel 432. The vent structure 439 can include one or more air moving devices that induce airflow from the mixing plenum 438 to the bounded enclosure 412 as intake air 442.

In some embodiments, the exhaust air 490 may be received into the mixing plenum 438 via one or more vents 431 mounted in one or more side walls of the plenum module 430. The vents 431 can communicatively couple the internal exhaust air plenum 426 of at least one free-standing exhaust plenum structures 410 with the mixing plenum 438 when the plenum module 430 is mounted at least partially on a support arm structure 425 of the free-standing exhaust plenum structure 410, where exhaust air 490 can be directed through a gap in an enclosure face of the free-standing exhaust plenum structure 410 that faces the bounded enclosure 412, through the vents 431, and into the mixing plenum 438 to be mixed with cooling air. The vents 431 may include one or more adjustable dampers that can be adjusted to control the flow of exhaust air into the mixing plenum 438.

In some embodiments, a vent 431 is mounted in the enclosure face of one or more free-standing exhaust plenum structures 410 adjacent to the plenum module 430. The air directed into the mixing plenum 438 from the cooling air plenum 440, which can include cooling air, may be mixed with the exhaust air directed into the mixing plenum 438 from one or more plenums 426 to provide mixed air. Adjustable dampers of the vent structures 439 to the mixing plenum 438 from the free-standing exhaust plenum structure may be adjusted to control the flow of exhaust air into the mixing plenum 438 to maintain one or more particular characteristics of the mixed air, including one or more of temperature, relative humidity, wet-bulb temperature, etc.

Figure 5:
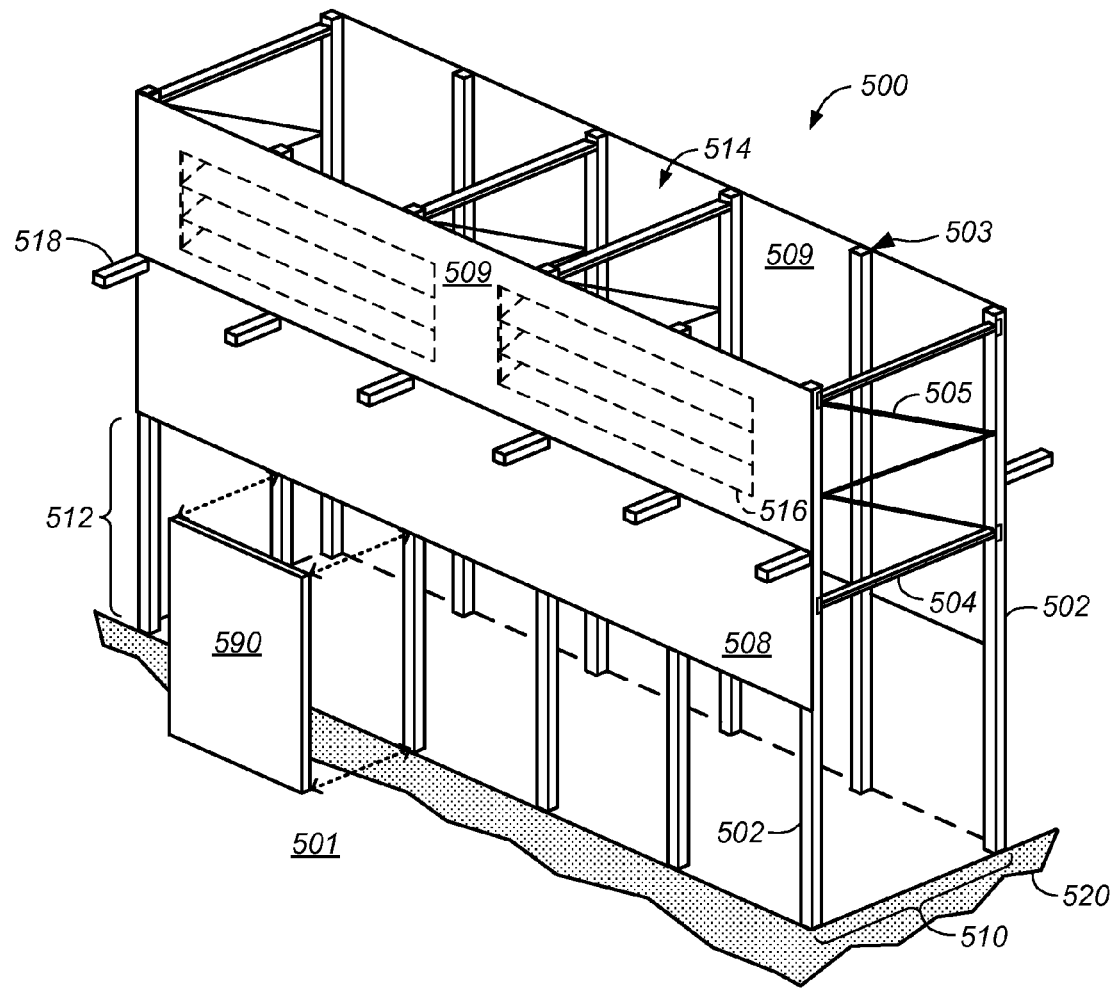
FIG. 5 illustrates a free-standing exhaust plenum structure according to some embodiments.

FIG. 5 illustrates a free-standing exhaust plenum structure 500 according to some embodiments.

In some embodiments, a free-standing exhaust plenum structure 500 includes a free-standing frame 503. The free standing frame 503 can include one or more frame members 502, 504, 505 that collectively encompass an interior space 510 and define an outline of the free-standing exhaust plenum structure 500. Where the frame 503 includes multiple frame members 502, 504, 505, the members 502, 504, 505 may be coupled together via one or more known coupling methods, including bolting, welding, riveting, etc. One or more frame members may include post members 502 that extend vertically through the structure and can transmit at least some of the structural load of the structure 500 to a floor element 520. One or more frame members may include one or more lateral bracing members 504, angular bracing members 505, some combination thereof, or the like that provide at least some structural support to the structure 500.

In some embodiments, the free-standing exhaust plenum structure 500 includes one or more wall elements 508, 509 that are coupled to one or more frame members 502, 504, 505 of the free-standing frame 503. In some embodiments, one or more of the wall elements 508, 509 include cladding which can restrict airflow between opposite faces of the cladding. In some embodiments, one or more of the wall elements 508, 509 includes an insulating material that mitigates heat transfer between separate environments in communication with separate faces of the one or more wall elements 508, 509. In some embodiments, coupling one or more wall elements to frame members 502, 504, 505 includes encompassing at least a portion of one or faces of the free-standing exhaust plenum structure 500, so that an internal space 510 of the free-standing exhaust plenum structure 500 is encompassed to establish an the internal exhaust air plenum that can receive and direct exhaust air through the plenum and out of an exhaust vent 514, which, as illustrated, may include a top portion of the free-standing exhaust plenum structure 500 that is substantially unencompassed by wall elements 508, 509, a vent structure located on the top portion of the free-standing exhaust plenum structure, etc.

In some embodiments, wall elements 508, 509 are coupled to one or more frame members 502, 504, 505 on a portion of one or more faces of the free-standing exhaust plenum structure 500. For example, as illustrated, wall elements 508, 509 may cover a limited portion of a face of the free-standing exhaust plenum structure 500, so that a gap 512 remains through which exhaust air may be received from one or more waste heat sources into the interior exhaust air plenum 510 of the free-standing exhaust plenum structure 500. Another gap may be present in a wall element coupled to an upper portion of a face of a free-standing exhaust plenum structure, so that at least some of the exhaust air circulating through the internal exhaust air plenum of the free-standing exhaust plenum structure can be redirected to another external plenum via one or more vents 516 mounted in the gap.

In some embodiments, one or more wall panel elements 590 are coupled to one or more portions of the free-standing exhaust plenum structure 500 to enclose at least a portion of the gap 512. The panel element 590 can partition space 501 from internal plenum 510, and can generally inhibit unwanted airflow between the spaces in the absence of waste heat sources mounted proximate to the gap. For example, when a rack is mounted to abut a portion of the gap 512, the interface between the rack and the structure 500 can be sealed via various sealing element so that air does not flow from the plenum 510 to space 501, or from space 501 to plenum 510, without passing through the interior of the rack. General inhibition of airflow can by a removable panel can include a panel enclosing a portion of the gap 512 within manufacturing tolerances of construction of one or more of the panel 590, wall element 508, frame 503, etc., where air leakage across the enclosed portion may occur, although airflow is sufficiently inhibited to enable a pressure difference between space 501 and plenum 510 to be maintained. Where a waste heat source is not mounted in space 501 abutting a portion of the gap, a wall panel element 590 can be coupled to the frame structure 503 to enclose that particular portion of the gap 512, thereby precluding airflow between space 501 and plenum 510 that does not flow through a waste heat source from space 501 into plenum 510. The wall panel elements 509 can be removably coupled to the structure 503 so that the plenum 510 can be partitioned from space 501 in the absence of waste heat sources to abut the gap, and a gap 512 can be established in a face of the structure 500 when a waste heat source is to be installed in space 501, so that the waste heat source can be abut the established gap 512 and discharge exhaust air into the plenum 510 via the established gap 512.

In some embodiments, multiple types of wall elements may be coupled to one or more faces of the free-standing exhaust plenum structure. For example, one or more wall elements 509 that include an insulating material may be coupled to an upper portion of a face of a free-standing exhaust plenum structure that faces a cooling air plenum, so that the wall elements mitigate heat transfer from exhaust air circulating through the internal exhaust air plenum 510 to one or more air plenums external to the free-standing exhaust plenum structure 500, and one or more wall elements 508 that are substantially free from insulating materials may be coupled to a lower portion of the same face of the free-standing exhaust plenum structure that faces a bounded enclosure.

In some embodiments, wall elements are coupled on various sides of frame members in the free-standing frame 503. For example, in the illustrated embodiment, wall elements 508, 509 are coupled to outer sides of the free-standing frame 503, so that at least the vertical members 502 are between the wall elements 508, 509 and the internal plenum 510. In some embodiments, one or more wall elements, including cladding elements, insulating elements, etc. are coupled to inner sides of the free-standing frame 503, so that the wall elements are positioned between at least some of the frame members 502 and the internal plenum 510. Separate wall elements may be coupled on inner sides and outer sides of the free-standing frame 503, so that some wall elements coupled to an outer side of the frame, referred to as "outer wall elements", and some wall elements coupled to an inner side of the frame, referred to as "inner wall elements", establish a gap between the two elements.

In some embodiments, a free-standing support structure 500 includes one or more support arm structures 518, also referred to hereinafter as support "arms", that are coupled to one or more portions of the structure 500, including one or more frame members 502, 504, 505. Each arm 518 may be coupled to one or more of the frame members so that at least a portion of the arm extends outward from a face of the free-standing exhaust plenum structure 500. For example, in the illustrated embodiment, arms 518 are coupled to post member 502 that each define a portion of a face of the free-standing exhaust plenum structure 500 facing a particular space 501, the arms 518 may extend away from the post members 502 and the enclosure 510 of the free standing structure 500 in a direction that is substantially perpendicular to at least one face of the free-standing exhaust plenum structure and extends into the space 501. Each arm 518 can, in some embodiments, support a structural load and transmit at least a portion of the load to at least a portion of the free-standing exhaust plenum structure 500, so that at least a portion of the free-standing exhaust plenum structure 500 supports the structural load supported by the arm 518.

In some embodiments, including the illustrated embodiment, one or more arms can support one or more trays, which themselves can support one or more infrastructure elements. Various infrastructure elements that can be installed can include power distribution infrastructure, including power busses, power transmission lines, power distribution units, etc. Various infrastructure elements that can be installed can include lighting components, communication components including networking cables, etc. The infrastructure may be installed via mounting on one or more support elements mounted in the bounded enclosure. The support elements may include trays, busways, etc. which may be coupled to one or more free-standing exhaust plenum structures, plenum modules, etc. to route the various infrastructure elements through the bounded enclosure. The support elements may support one or more elements of power and communication infrastructure, including cabling, transmission lines, etc. which are routed to various computer systems installed in various racks that are installed in the bounded enclosure.

In some embodiments, one or more support arm structures 518 include one or more sealing elements on one or more surfaces of the arms, including one or more upper surfaces. The sealing elements, which can include one or more foam sealing elements, gasket elements, etc., can seal one or more interfaces between the arm 518 and one or more elements mounted upon the surface of the arm that includes the seal.

For example, where an arm 518 includes a sealing element on an upper surface of the arm, 518, and a plenum module is mounted on the arm 518 so that a lower surface of the plenum module rests upon an upper surface of the arm 518, the foam seal can seal the interface between the plenum module and the upper surface of the arm 518 to at least partially mitigate, restrict, preclude, etc. airflow, air leakage, and the like through the interface. In some embodiments, a sealing element comprises an L-channel element on one or more ends of a support arm structure extending away from a face of a free-standing exhaust plenum structure, where the L-channel element can receive a portion of a bottom surface and a side surface of a plenum module to seal an interface between the arm 518 and the plenum module.

In some embodiments, the free-standing exhaust plenum structure 500 is configured to be mounted in an interior enclosure space. The interior enclosure space may include an encompassed interior space, including a warehouse structure, which includes a floor 520, ceiling exhaust plenum, air handling system, etc. A free-standing exhaust plenum structure 500 may be coupled to the floor element 520 to establish at least one side of a bounded enclosure within the interior enclosure, including a cold aisle space, which extends substantially parallel to at least one axis of the cold aisle space.

In some embodiments, one or more free-standing exhaust plenum structures 500 are shipped to a data center site prior to coupling with other elements, including one or more plenum modules, to establish a data center row infrastructure module at the site. Each free-standing exhaust plenum structure 500 or portion thereof may be transported separately, such as on a semi-trailer. In certain embodiments, however, all or some portions of the free-standing exhaust plenum structure 500 may be assembled at the data center site. For example, free-standing exhaust plenum structures 500 and a plenum module may be coupled together at a site to establish a row infrastructure module, and racks may be installed in the row infrastructure module.

In some embodiments, coupling a structure 500 to the floor 520 can include placing the structure 500 on the floor 520 so that the structure 500 rests upon an upper surface of the floor, securing the structure to the floor via one or more coupling elements, bolts, welds, etc., some combination thereof, or the like.

In some embodiments, one or more of the components comprised in the free-standing exhaust plenum structure 500 includes components that can be utilized for shelving systems. For example, the frame 503 of free-standing exhaust plenum structure 500 can comprise a free-standing pallet shelving rack. A free-standing pallet shelving rack, as utilized for storing and stacking pallets, may include multiple lateral bracing members 504 and angular bracing members 505 through the interior of the structure to provide shelves to support the pallets. The free-standing exhaust plenum structure 500, in some embodiments, includes a free-standing pallet shelving rack where multiple lateral bracing members are removed to open up the interior 510 of the structure 500 to comprise the internal exhaust air plenum 510, and one or more wall elements 508, 509 are coupled to one or more faces of the structure 500 to at least partially encompass the internal exhaust air plenum 510, etc.

In another example, one or more support arm structures 518 of a free-standing exhaust plenum structure 500 may comprise support arms of a drive-through pallet shelving system. A drive-through pallet shelving system, as utilized for storing and stacking pallets, may include multiple particularly-spaced vertical posts, which may not comprise free-standing exhaust plenum structures, that are bolted to a floor element and each include one or more support arm structures that extend into a space between the posts, where a pallet can be moved into the spaces and lifted to rest upon multiple support arm structures extending from multiple posts into a common space. In a drive-through pallet shelving system, the pallets may be moved and lifted by a forklift vehicle. The free-standing exhaust plenum structure 500, in some embodiments, includes one or more support arm structures 518 of a drive-through pallet shelving system that are coupled to one or more frame members 502, 504, 505 of the free-standing exhaust plenum structure 500. In some embodiments, at least a portion of a free-standing exhaust plenum structure 500 can be assembled via coupling of selected elements of the separate shelving systems, including the frame members and support arm structures.

Figure 6:
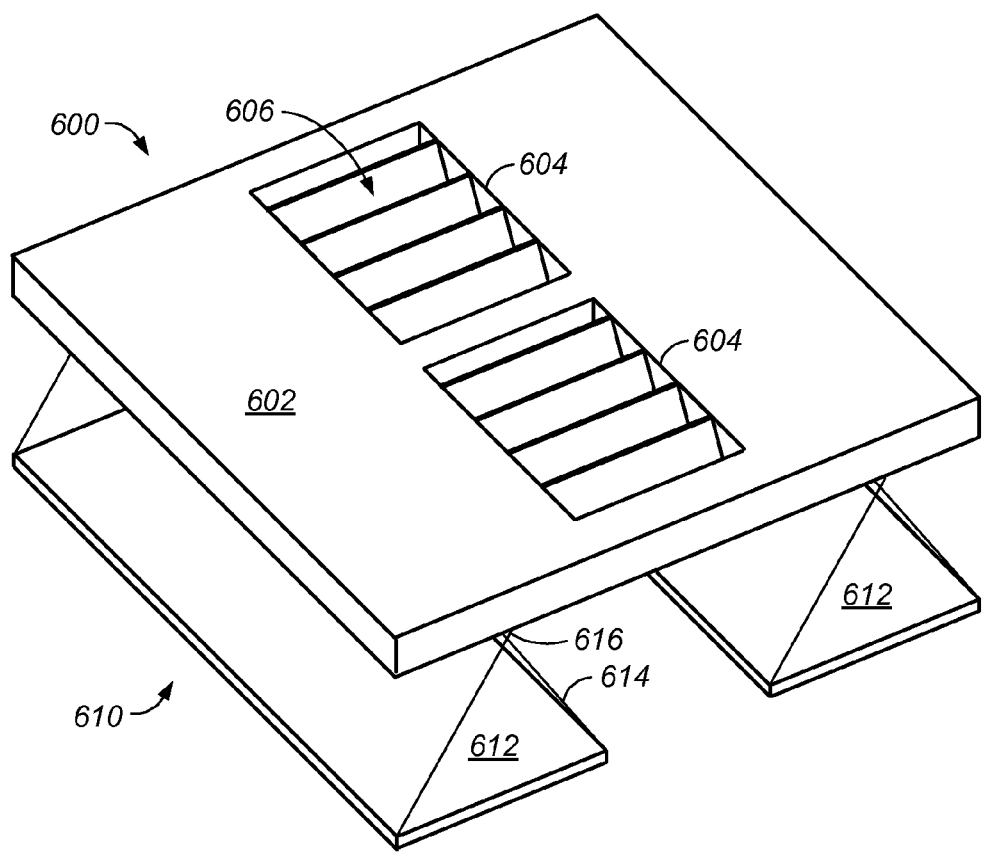
FIG. 6 is a perspective view of a plenum module according to some embodiments.

FIG. 6 is a perspective view of a plenum module according to some embodiments.

In some embodiments, a plenum module is configured to be mounted between at least two free-standing exhaust plenum structures on opposite sides of a bounded enclosure, so that the plenum module spans substantially between the two structures and establishes a top end of the bounded enclosure. Where the two structures are located on opposite ends of a cold aisle space, the plenum module can be configured to be mounted between the two structures to establish a top end of the cold aisle space via a lower surface of the plenum module. The plenum module may be configured to establish a bottom end of another enclosure, including a cooling air plenum, via another surface of the plenum module, which may include an upper surface of the plenum module. The plenum module, spanning between two free-standing exhaust plenum structures on opposite sides of a bounded enclosure, may be configured to be mounted on one or more separate support arms of each of the structures, so that a portion of the load of the plenum module is supported by one of the structures and another portion of the load is supported by another one of the structures.

In some embodiments, a plenum module comprises a panel element that, when mounted to span between two free-standing exhaust plenum structures, separates a cooling air plenum and a bounded enclosure. In the illustrated embodiment, for example, plenum module 600 includes a panel element 602 that, when the plenum module 600 is mounted on respective support arm structures of separate free-standing exhaust plenum structures, establish a ceiling of a bounded enclosure and establish a floor of a cooling air plenum. The plenum module 600 can include one or more air vents 604 that are configured to direct air, which can include cooling air from a cooling air plenum, through the panel 602 to a bounded enclosure to provide intake air to the bounded enclosure, so that intake air is provided to computer systems in racks in the enclosure space to remove waste heat from the computer systems. The vents 604 may include one or more dampers 606 which can be adjusted to control flow rates of intake air into the bounded enclosure.

In some embodiments, a plenum module includes one or more support trays, which themselves can support one or more infrastructure elements. Trays may be coupled to the plenum module, suspended from the plenum module, etc. For example, in the illustrated embodiment, plenum module 600 includes a support tray 610, comprised of a structural element 612, which is suspended from the panel 602 of the plenum module 600 via one or more support cabling 614 coupling the element 612 to a load bearing structure 616 of the plenum module 600. Such an embodiment of a support tray 610 can be configured to hang from the plenum module in a bounded enclosure that is bounded on a top end by the lower surface of panel 602. Various infrastructure elements that can be supported by the support tray 610 can include power distribution infrastructure, including power busses, power transmission lines, power distribution units, lighting components, communication components including networking cables, etc. One or more elements of the infrastructure elements, including power busses, transmission lines communication components, etc. can be routed to various computer systems installed in various racks that are installed in the bounded enclosure.

Figure 7:
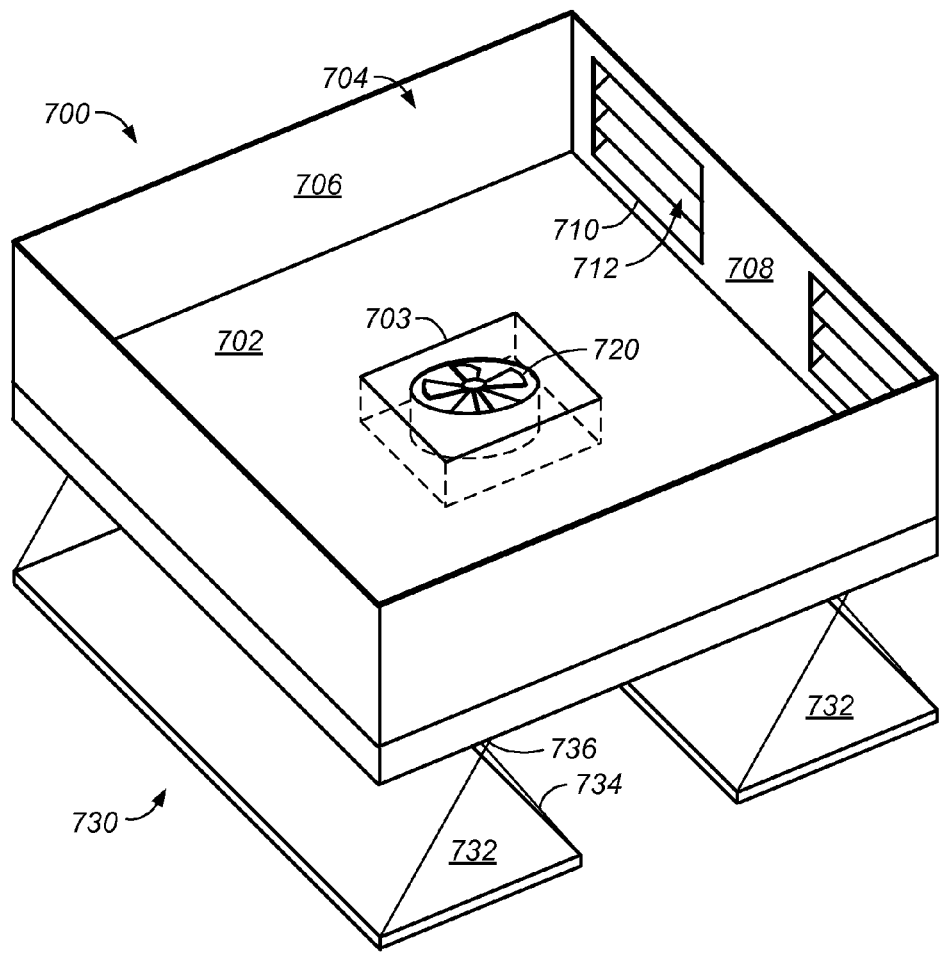
FIG. 7 is a perspective view of a plenum module according to some embodiments.

FIG. 7 is a perspective view of a plenum module according to some embodiments.

In some embodiments, a plenum module includes one or more structural elements that establish a mixing plenum that mixes cooling air received from a cooling air plenum and at least some exhaust air received from an internal exhaust air plenum of at least one free-standing exhaust plenum structure to produce a mixed air. The mixed air can be directed into the bounded enclosure, via an air vent. For example, in the illustrated embodiment, plenum module 700 includes a panel element 702 and side walls 706, 708 that at least partially enclose an interior space. The interior space, referred to hereinafter as a "mixing plenum" 704, is configured to mix cooling air received from a cooling air plenum via the unencompassed top end of the plenum, and at least some recirculated exhaust air to provide mixed air that can be supplied to a bounded enclosure through the panel 702 via a vent structure 703 in the panel 702. The vent structure 703 can include one or more air moving devices 720 that induce airflow from the mixing plenum 704 to the bounded enclosure. In some embodiments, a plenum module includes multiple air moving devices 720.

In some embodiments, the exhaust air may be directed into the mixing plenum 704 via one or more vents 710 mounted in one or more side walls 708 of the plenum module 700. The vents 710 can communicatively couple the internal exhaust air plenum of at least one free-standing exhaust plenum structure with the mixing plenum 700 when the plenum module 700 is mounted at least partially on a support arm structure of the free-standing exhaust plenum structure, where exhaust air can be directed through a gap in a face of the free-standing exhaust plenum structure that faces the bounded enclosure, through the vents 710, and into the mixing plenum 704 to be mixed with cooling air. The vents 710 may include one or more adjustable dampers 712 that can be adjusted to control the flow of exhaust air into the mixing plenum 704.

In some embodiments, the vents 710 are mounted in a face of a free-standing exhaust plenum structure adjacent to the plenum module 700, a sidewall 708 of the mixing plenum 704 that is adjacent to a gap in the face of the free-standing exhaust plenum structure, etc.

The air directed into the mixing plenum 704 from the cooling air plenum, which can include cooling air, may be mixed with the exhaust air directed into the mixing plenum 704 to provide mixed air. The adjustable dampers 712 of the vents 710 to the mixing plenum from the free-standing exhaust plenum structure may be adjusted to control the flow of exhaust air into the mixing plenum to maintain one or more particular characteristics of the mixed air, including one or more of temperature, relative humidity, wet-bulb temperature, etc.

Mixed air can be directed into one or more bounded enclosures of one or more row infrastructure modules from at least the mixing plenum 704 of the plenum module 700. Where a bounded enclosure includes an enclosure, including a cold aisle space that is bounded on a bottom end by a floor element, on side ends by free-standing exhaust plenum structures, and a top end by the plenum module 700, and includes one or more racks that can accommodate one or more computer systems, mixed air can be directed into the bounded enclosure via one or more vent structures 703 in at least a lower surface of the plenum module 700, where the upper surface of the plenum module may bound a lower end of the mixing plenum, and enables air to flow from the mixing plenum 704 into the bounded enclosure. Air directed into the bounded enclosure from at least the mixing plenum may be referred to as "intake air" with respect to the bounded enclosure. In some embodiments, where the vent 703 of the plenum module includes one or more air moving devices 720, air is supplied into the bounded enclosure based at least in part upon operation of the one or more air moving devices 720. The vent structure 703 may include one or more dampers that may be adjustably controlled to manage the flow rate of intake air into the bounded enclosure.

In some embodiments, a plenum module includes one or more support trays, which themselves can support one or more infrastructure elements. Trays may be coupled to the plenum module, suspended from the plenum module, etc. For example, in the illustrated embodiment, plenum module 700 includes a support tray 730, comprised of a structural element 732, which is suspended from the panel 702 of the plenum module 700 via one or more support cabling 734 coupling the element 732 to a load bearing structure 736 of the plenum module 700. Such an embodiment of a support tray 730 can be configured to hang from the plenum module in a bounded enclosure that is bounded on a top end by the lower surface of panel 702. Various infrastructure elements that can be supported by the support tray 730 can include power distribution infrastructure, including power busses, power transmission lines, power distribution units, lighting components, communication components including networking cables, etc. One or more elements of the infrastructure elements, including power busses, transmission lines communication components, etc. can be routed to various computer systems installed in various racks that are installed in the bounded enclosure.

Figure 8:
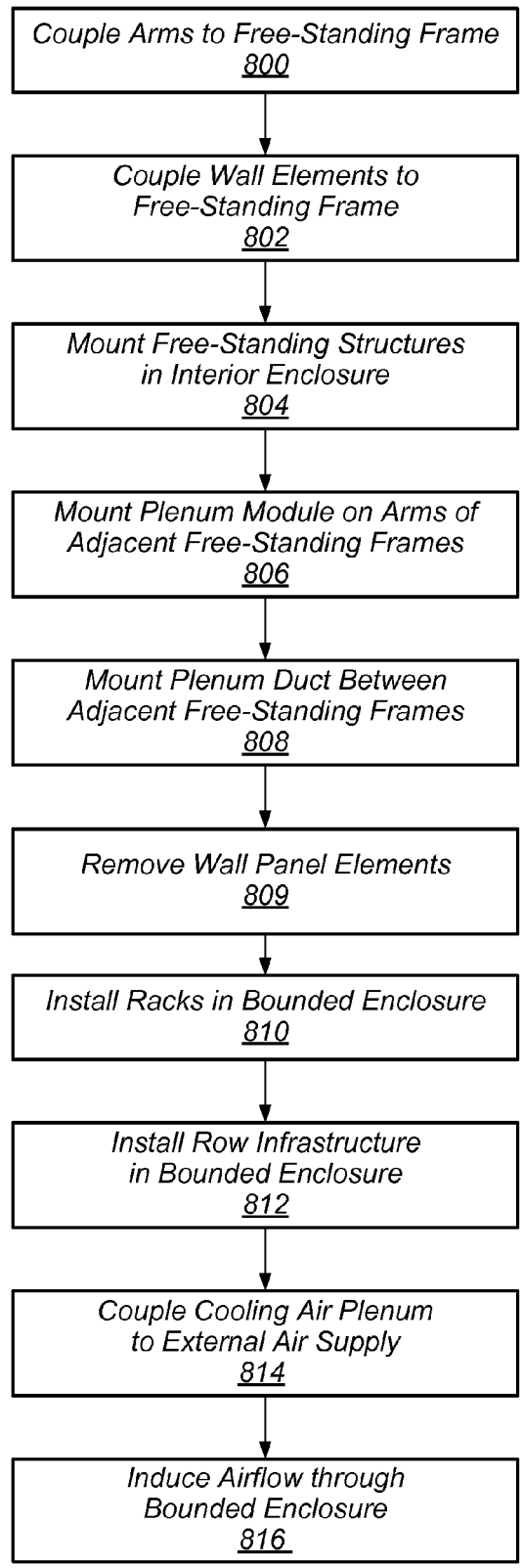
FIG. 8 illustrates providing a data center row infrastructure module in a data center according to some embodiments.

FIG. 8 illustrates providing a data center row infrastructure module in a data center according to some embodiments.

At 800, one or more support structures, also referred to hereinafter as support "arms", are coupled to a free-standing frame. The free standing frame can include one or more frame members that collectively encompass an interior space and define an outline of a free-standing exhaust plenum structure. Where the frame includes multiple frame members, the members may be coupled together via one or more known coupling methods, including bolting, welding, riveting, etc. One or more frame members may include post members that extend vertically through the structure and can transmit at least some of the structural load of the structure to a floor element. One or more frame members may include bracing members that provide at least some lateral structural support to the structure. Each arm may be coupled to one or more of the frame members so that at least a portion of the arm extends outward from a face of the free-standing exhaust plenum structure. For example, where an arm is welded to a post member that defines a corner of the free-standing exhaust plenum structure, the arm may extend away from the post member and the enclosure of the free standing structure in a direction that is substantially perpendicular to at least one face of the free-standing exhaust plenum structure. Each arm can, in some embodiments, support a structural load and transmit at least a portion of the load to at least a portion of the free-standing exhaust plenum structure, so that at least a portion of the free-standing exhaust plenum structure supports the structural load supported by the arm.

At 802, one or more wall elements are coupled to one or more frame members of the free-standing frame. In some embodiments, one or more of the wall elements include cladding which can restrict airflow between opposite faces of the cladding. In some embodiments, one or more of the wall elements includes an insulating material that mitigates heat transfer between separate environments in communication with separate faces of the one or more wall elements. In some embodiments, coupling one or more wall elements to frame members includes encompassing at least a portion of one or more faces of the free-standing exhaust plenum structure, so that an internal space of the free-standing exhaust plenum structure is encompassed to establish an air plenum. The air plenum in the interior of the free-standing exhaust plenum structure, as noted in the previous figures, can include an exhaust air plenum that can receive and direct exhaust air through the plenum and out of an exhaust port, which may include a top portion of the free-standing exhaust plenum structure that is substantially unencompassed by wall elements, a vent structure located on the top portion of the free-standing exhaust plenum structure, etc.

In some embodiments, wall elements are coupled to one or more frame members on a portion of one or more faces of the free-standing exhaust plenum structure.

For example, as illustrated in at least FIG. 2B and FIGS. 5-6, wall elements may cover a limited portion of a face of the free-standing exhaust plenum structure, so that a gap remains through which exhaust air may be received from one or more waste heat sources into the interior exhaust air plenum of the free-standing exhaust plenum structure. In some embodiments, one or more wall panel elements are coupled to a limited portion of a face of the free-standing exhaust plenum structure to enclose the gap and generally inhibit airflow between the interior exhaust air plenum and an external environment through the enclosed gap in the face of the free-standing exhaust plenum structure. Another gap may be present in a wall element coupled to an upper portion of a face of a free-standing exhaust plenum structure, so that at least some of the exhaust air circulating through the internal exhaust air plenum of the free-standing exhaust plenum structure can be redirected to another external plenum via one or more vents mounted in the gap. In some embodiments, multiple types of wall elements may be coupled to one or more faces of the free-standing exhaust plenum structure. For example, one or more wall elements that include an insulating material may be coupled to an upper portion of a face of a free-standing exhaust plenum structure, so that the wall elements mitigate heat transfer from exhaust air circulating through the internal exhaust air plenum to one or more air plenums external to the free-standing exhaust plenum structure, and one or more wall elements that are substantially free from insulating materials may be coupled to a lower portion of the same face of the free-standing exhaust plenum structure.

At 804, one or more free-standing exhaust plenum structures are mounted in an interior enclosure. The interior enclosure may include an encompassed interior space, including a warehouse structure, which includes a floor, ceiling exhaust plenum, air handling system, etc. A free-standing exhaust plenum structure may be coupled to the floor element to establish at least one side of a bounded enclosure within the interior enclosure, including a cold aisle space, which extends substantially parallel to at least one axis of the cold aisle space. The axis can include a long axis of the space, a short axis of the space, etc. In some embodiments, two free-standing exhaust plenum structures are coupled to the floor on opposite sides of the cold aisle space. The sides of the cold aisle space may be predetermined, determined based at least in part upon the coupling of one or more free-standing exhaust plenum structures in one or more particular locations on the floor, etc. For example, two free-standing exhaust plenum structures may be coupled to the floor at two particular locations, where the two free-standing exhaust plenum structures extend substantially in parallel and "face" each other across a space between the two structures, so that the space between the two structures is established as the cold aisle space and an axis of the cold aisle space is established as extending substantially in parallel with each of the two structures. In some embodiments, two free-standing exhaust plenum structures are mounted on opposite sides of a bounded enclosure, substantially in parallel, so that support arms of each of the structures extend into the bounded enclosure and towards the opposite respective free-standing exhaust plenum structure.

One or more modular elements, including one or more free-standing exhaust plenum structures, plenum modules, etc. can be shipped to a data center site. Each modular element or portion thereof may be transported separately, such as on a semi-trailer. In some embodiments, modular elements, or portions thereof, are pre-fabricated at one location, such as a factory, and transported to a data center site at another location. In certain embodiments, however, all or some portions of the modular elements for a data center row infrastructure module may be assembled at the data center site. For example, free-standing exhaust plenum structures and a plenum module may be coupled together at a site to establish a row infrastructure module, racks may be installed in the row infrastructure module. In some embodiments, the modular elements are pre-certified prior to shipment of the modular elements to the site.

In some embodiments, coupling a structure to the floor can include placing the structure on the floor so that the structure rests upon an upper surface of the floor, securing the structure to the floor via one or more coupling elements, bolts, welds, etc., some combination thereof, or the like.

At 806, a plenum module is mounted between at least two free-standing exhaust plenum structures on opposite sides of a bounded enclosure, so that the plenum module spans substantially between the two structures and establishes a top end of the bounded enclosure. Where the two structures are located on opposite ends of a cold aisle space, the plenum module is mounted between the two structures to establish a top end of the cold aisle space via a lower surface of the plenum module. The plenum module may establish a bottom end of another enclosure, including a cooling air plenum, via another surface of the plenum module, which may include an upper surface of the plenum module. The plenum module, spanning between two free-standing exhaust plenum structures on opposite sides of a bounded enclosure, may be mounted on one or more separate support arms of each of the structures, so that a portion of the load of the plenum module is supported by one of the structures and another portion of the load is supported by another one of the structures.

In some embodiments, the plenum module includes one or more air vents through which intake air can be directed from at least the cooling air plenum to the bounded enclosure bounded on a top end by the plenum module. The vent may include one or more dampers which can be adjusted to control flow rates of intake air into the bounded enclosure, one or more air moving devices that operate to draw the intake air into the bounded enclosure, etc.

In some embodiments, the plenum module includes one or more structural elements that establish a mixing plenum that mixes cooling air received from the cooling air plenum and at least some exhaust air received from an internal exhaust air plenum of at least one free-standing exhaust plenum structure to produce a mixed air. The mixed air can be directed into the bounded enclosure, via the air vent.

At 808, a plenum duct is mounted between at least two free-standing exhaust plenum structures on opposite sides of the bounded enclosure, so that the plenum duct spans substantially between the two structures and establishes a top end of a cooling air plenum that extends above at least one surface of the plenum module. In some embodiments, including embodiments where the plenum module includes an enclosure bounded on a bottom end by a lower surface and on a top end by an upper surface, a plenum duct may be omitted, as the upper surface of the plenum module may establish the top end of the cooling air plenum.

At 809, one or more wall panel elements are removed from a portion of a free-standing exhaust plenum structure that faces the bounded enclosure bounded by the two free-standing exhaust plenum structures and lower surface of the plenum module. The wall panel elements can be removed to establish a "gap" in the enclosure-facing side of the free-standing exhaust plenum structure that enables flow communication with an internal exhaust air plenum of the free-standing exhaust plenum structure. The gap can be established to enable one or more waste heat sources in the bounded enclosure discharge exhaust air into the internal exhaust air plenum of the free-standing exhaust plenum structure via the gap.

At 810, one or more racks are installed in the bounded enclosure bounded by the two free-standing exhaust plenum structures and lower surface of the plenum module. Where the bounded enclosure is a cold aisle space, two or more rows of racks may be installed in the space on opposite sides of the space. The two or more rows may extend substantially in parallel through the cold aisle space and may be installed adjacent to a portion of a respective one of the free-standing exhaust plenum structure. For example, where a portion of a free-standing exhaust plenum structure "facing" the cold aisle space includes a "gap", which may be at least partially established via the removal of wall panel elements from the portion of the free-standing structure, that enables flow communication with an internal exhaust air plenum of the free-standing exhaust plenum structure, a rack may be placed in the cold aisle space so that a rear end of the rack abuts the gap, and so that exhaust air discharged from one or more heat producing devices installed in the rack is discharged into the internal exhaust air plenum of the free-standing exhaust plenum structure via the gap. One or more computer systems may be installed in the racks, so that the computers may receive intake air that is directed into the bounded enclosure from at least a cooling air plenum via the plenum module and discharge exhaust air that has removed at least some heat from one or more heat producing components of the computer systems into the internal exhaust air plenum of at least one free-standing exhaust plenum structure, where the internal exhaust air plenum directs at least a portion of the exhaust air out of the row infrastructure module via at least one exhaust air vent of the free-standing exhaust plenum structure.

At 812, one or more elements of data center row infrastructure are installed in the bounded enclosure. Various infrastructure elements that can be installed can include power distribution infrastructure, including power busses, power transmission lines, power distribution units, etc. Various infrastructure elements that can be installed can include lighting components, communication components including networking cables, etc. The infrastructure may be installed via mounting on one or more support elements mounted in the bounded enclosure. The support elements may include trays, busways, etc. which may be coupled to one or more free-standing exhaust plenum structures, plenum modules, etc. to route the various infrastructure elements through the bounded enclosure. The support elements may support one or more elements of power and communication infrastructure, including cabling, transmission lines, etc. which are routed to various computer systems installed in various racks that are installed in the bounded enclosure.

At 814, the cooling air plenum at least partially established by the plenum module is coupled to an external air supply. Coupling the cooling air plenum to an external air supply can include coupling one end of the cooling air plenum to an air handling system, which may include one or more air moving devices, air cooling systems, etc., where the cooling air plenum can receive chilled air from the air handling system as cooling air. In some embodiments, coupling the cooling air plenum to an external air supply can include coupling one end of the cooling air plenum to a vent to an ambient environment, where the cooling air plenum can receive ambient air from the ambient environment as cooling air.

At 816, an airflow is induced through the bounded enclosure. Inducing airflow can include supplying intake air into the bounded enclosure, where the intake air can be received by one or more devices installed in the rack, remove heat from one or more heat producing components in the one or more devices, and then be discharged from the one or more devices as exhaust air into one or more internal exhaust air plenums of one or more free-standing exhaust plenum structures. The airflow can, in some embodiments, be induced by an external air handling system, which may include one or more air moving devices, which supplies cooling air to the cooling air plenum to be directed into the bounded enclosure via one or more vents of one or more plenum modules. The external air handling system may mix air that has been chilled via one or more various cooling systems with at least some exhaust air discharged from one or more exhaust vents of one or more free-standing exhaust plenum structures and directed to the external air handling system via at least an exhaust plenum of the interior enclosure that is external to the free-standing exhaust plenum structures to provide the cooling air. The airflow can, in some embodiments, be induced by one or more air moving devices included in one or more plenum modules, where the air moving devices draw air into the cooling air plenum from one or more external sources, which may include an ambient environment, and supply the drawn air into the bounded enclosure.

Figure 9:
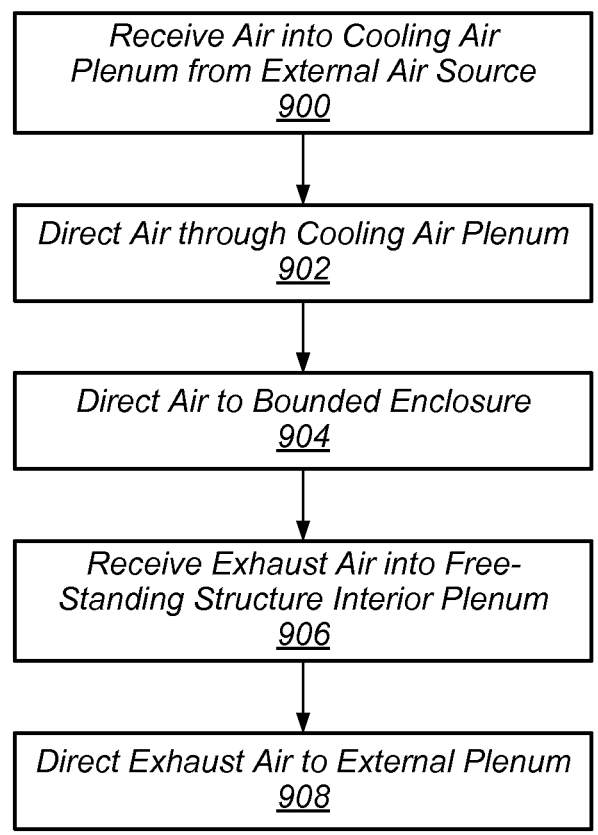
FIG. 9 illustrates managing air circulation in a computing enclosure via one or more components of a data center row infrastructure module according to some embodiments.

FIG. 9 illustrates managing air circulation in a computing enclosure via one or more components of a data center row infrastructure module according to some embodiments.

At 900, air is received into at least a portion of a cooling air plenum of a data center row infrastructure module in an interior enclosure from an external air source. The external air source, in some embodiments, can include one or more air handling systems that provide cooling air that is at least partially comprised of ambient air that is chilled via operation of one or more various air cooling systems. In some embodiments, the air handling systems mix recirculated exhaust air with chilled ambient air to provide the cooling air. The cooling air may be received from the external air source via one or more conduits, which may include one or more air ducts, which may direct the cooling air between the air handling system and the cooling air plenum. As a result, the air received into the cooling air plenum, in some embodiments, comprises mixed air that is a mixture of chilled air and recirculated exhaust air. The relative proportions of chilled air and exhaust air in mixed air may be controlled, via operation of one or more dampers, air moving devices, etc., based on one or more environmental conditions in one or more bounded enclosures of one or more row infrastructure modules. The relative proportions may be controlled to maintain the one or more environmental conditions within one or more ranges of predetermined values, including ranges of temperature, relative humidity, wet bulb temperature, etc.

At 902, air received into at least a portion of a cooling air plenum of a row infrastructure module is directed through a portion of the cooling air plenum. The air, which may include cooling air, may be directed through the cooling air plenum based at least in part upon one or more gradients in the portion of the cooling air plenum, which may include a pressure gradient, temperature gradient, etc. For example, where air is received into the cooling air plenum from an external air source that includes an air moving device, the air moving device may increase the air pressure upstream of the cooling air plenum relative to various vents through which air can exit the cooling air plenum, including one or more vents that communicatively couple the cooling air plenum and a bounded enclosure of the row infrastructure module, so that air is "pushed" into and through one or more portions of the cooling air plenum toward the various vents. In another example, where air is received into the cooling air plenum from an external air source that includes an ambient environment, one or more air moving devices in flow communication with the cooling air plenum may operate to reduce the air pressure at a point downstream of the cooling air plenum, including at one or more vents that communicatively couple the cooling air plenum and a bounded enclosure of the row infrastructure module, so that air is "pulled" into and through one or more portions of the cooling air plenum toward the various vents. Various portions components that establish one or more boundaries of the cooling air plenum, including portions of one or more plenum ducts, plenum modules, free-standing exhaust plenum structures, etc., may direct air through one or more portions of the cooling air plenum toward one or more vents to a bounded enclosure.

At 904, air is directed into one or more bounded enclosures of one or more row infrastructure modules from at least a cooling air plenum of the respective row infrastructure module. Where a bounded enclosure includes an enclosure, including a cold aisle space that is bounded on a bottom end by a floor element, on side ends by free-standing exhaust plenum structures, and a top end by a plenum module, and includes one or more racks that can accommodate one or more computer systems, air can be directed into the bounded enclosure via one or more vents in at least a lower surface of the plenum module that enables air to flow from the cooling air plenum into the bounded enclosure. Air directed into the bounded enclosure from at least the cooling air plenum may be referred to as "intake air" with respect to the bounded enclosure. In some embodiments, where the vent of the plenum module includes one or more air moving devices, air is supplied into the bounded enclosure based at least in part upon operation of the one or more air moving devices. The vent may include one or more dampers that may be adjustably controlled to manage the flow rate of intake air into the bounded enclosure.

At 906, exhaust air is received into one or more free-standing exhaust plenum structures of one or more row infrastructure modules from one or more bounded enclosures. The exhaust air may be received into one or more internal exhaust air plenums included in an interior of the one or more free-standing exhaust plenum structures. The exhaust air may be received from one or more heat producing components of one or more devices installed in one or more racks that are installed in the bounded enclosure. The exhaust air may be precluded from returning to the bounded enclosure via one or more wall elements bounding one or more faces of the free-standing exhaust plenum structure, one or more seal elements that seal interfaces between the wall elements and racks installed in the bounded enclosure abutting gaps in the free-standing exhaust plenum structure faces, etc.

At 908, exhaust air in one or more internal exhaust air plenums of one or more free-standing exhaust plenum structures in one or more row infrastructure modules is directed to an external location, including one or more exhaust plenums that are external to the row infrastructure module. Exhaust air can be directed to an external location via one or more exhaust vents in the free-standing exhaust plenum structures that enable flow communication between one or more internal exhaust air plenums of the free-standing exhaust plenum structures and an external environment. The external environment can include one or more portions of an interior enclosure in which the row infrastructure module is located, including an exhaust plenum in an upper portion of the interior enclosure. In some embodiments, exhaust air is directed to an external environment, which may include an interior enclosure exhaust plenum, based at least in part upon a chimney effect whereby the exhaust air rises through the internal exhaust plenum and out of one or more exhaust vents located on a top side of the free-standing exhaust plenum structure to rise out of the free-standing exhaust plenum structure and into the external environment. In some embodiments, exhaust air may be directed to the external environment based at least in part upon a pressure gradient between the internal exhaust air plenum and the external environment, which may be induced based at least in part upon one or more air moving devices that may be located in one or more of the external environment, exhaust vents, internal exhaust air plenum, some combination thereof, or the like.

Figure 10:
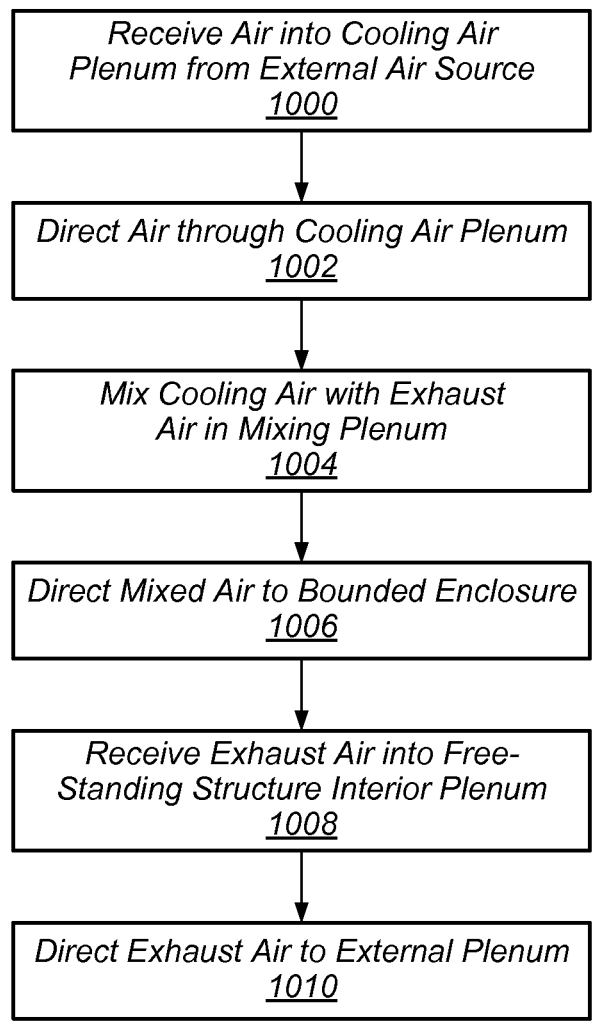
FIG. 10 illustrates managing air circulation in a computing enclosure via one or more components of a data center row infrastructure module according to some embodiments.

FIG. 10 illustrates managing air circulation in a computing enclosure via one or more components of a data center row infrastructure module according to some embodiments.

At 1000, air is received into at least a portion of a cooling air plenum of a row infrastructure module in an interior enclosure from an external air source. The cooling air may be received from the external air source via one or more conduits, which may include one or more air ducts, which may direct the cooling air between the air handling system and the cooling air plenum. In some embodiments, the external air source includes an ambient environment, and the air received into the portion of the cooling air plenum as cooling air includes ambient air received from the ambient environment.

At 1002, air received into at least a portion of a cooling air plenum of a row infrastructure module is directed through a portion of the cooling air plenum. The air, which may include cooling air, may be directed through the cooling air plenum based at least in part upon one or more gradients in the portion of the cooling air plenum, which may include a pressure gradient, temperature gradient, etc. For example, where air is received into the cooling air plenum from an external air source that includes an air moving device, the air moving device may increase the air pressure upstream of the cooling air plenum relative to various vents through which air can exit the cooling air plenum, including one or more vents that communicatively couple the cooling air plenum and a bounded enclosure of the row infrastructure module, so that air is "pushed" into and through one or more portions of the cooling air plenum toward the various vents. In another example, where air is received into the cooling air plenum from an external air source that includes an ambient environment, one or more air moving devices in flow communication with the cooling air plenum may operate to reduce the air pressure at a point downstream of the cooling air plenum, including at one or more vents that communicatively couple the cooling air plenum and a bounded enclosure of the row infrastructure module, so that air is "pulled" into and through one or more portions of the cooling air plenum toward the various vents. Various portions components that establish one or more boundaries of the cooling air plenum, including portions of one or more plenum ducts, plenum modules, free-standing exhaust plenum structures, etc., may direct air through one or more portions of the cooling air plenum toward one or more vents to a bounded enclosure.

At 1004, air that is directed through one or more portions of the cooling air plenum is directed to a mixing plenum and mixed with at least a portion of exhaust air that is directed into the mixing plenum from an internal exhaust air plenum of at least one free-standing exhaust plenum structure. The exhaust air may be directed into the mixing plenum via one or more vents that communicatively couple the internal exhaust air plenum with the mixing plenum. The vents may include one or more adjustable dampers that can be adjusted to control the flow of exhaust air into the mixing plenum, and the vents may be mounted in a face of the free-standing exhaust plenum structure, a face of the mixing plenum that is adjacent to a gap in the face of the free-standing exhaust plenum structure, etc. The air directed into the mixing plenum from the cooling air plenum, which can include cooling air, may be mixed with the exhaust air directed into the mixing plenum to provide mixed air. The adjustable dampers of the vents to the mixing plenum from the free-standing exhaust plenum structure may be adjusted to control the flow of exhaust air into the mixing plenum to maintain one or more particular characteristics of the mixed air, including one or more of temperature, relative humidity, wet-bulb temperature, etc.

At 1006, mixed air is directed into one or more bounded enclosures of one or more row infrastructure modules from at least the mixing plenum of the respective row infrastructure module. Where a bounded enclosure includes an enclosure, including a cold aisle space that is bounded on a bottom end by a floor element, on side ends by free-standing exhaust plenum structures, and a top end by a plenum module, and includes one or more racks that can accommodate one or more computer systems, mixed air can be directed into the bounded enclosure via one or more vents in at least a lower surface of the plenum module, where the lower surface of the plenum module may bound a lower end of the mixing plenum, and enables air to flow from the mixing plenum into the bounded enclosure. Air directed into the bounded enclosure from at least the mixing plenum may be referred to as "intake air" with respect to the bounded enclosure. In some embodiments, where the vent of the plenum module includes one or more air moving devices, air is supplied into the bounded enclosure based at least in part upon operation of the one or more air moving devices. The vent may include one or more dampers that may be adjustably controlled to manage the flow rate of intake air into the bounded enclosure.

At 1008, exhaust air is received into one or more free-standing exhaust plenum structures of one or more row infrastructure modules from one or more bounded enclosures. The exhaust air may be received into one or more internal exhaust air plenums included in an interior of the one or more free-standing exhaust plenum structures. The exhaust air may be received from one or more heat producing components of one or more devices installed in one or more racks that are installed in the bounded enclosure. The exhaust air may be precluded from returning to the bounded enclosure via one or more wall elements bounding one or more faces of the free-standing exhaust plenum structure, one or more seal elements that seal interfaces between the wall elements and racks installed in the bounded enclosure abutting gaps in the free-standing exhaust plenum structure faces, etc.

At 1010, exhaust air in one or more internal exhaust air plenums of one or more free-standing exhaust plenum structures in one or more row infrastructure modules is directed to an external location, including one or more exhaust plenums that are external to the row infrastructure module. Exhaust air can be directed to an external location via one or more exhaust vents in the free-standing exhaust plenum structures that enable flow communication between one or more internal exhaust air plenums of the free-standing exhaust plenum structures and an external environment. The external environment can include one or more portions of an interior enclosure in which the row infrastructure module is located, including an exhaust plenum in an upper portion of the interior enclosure. In some embodiments, exhaust air is directed to an external environment, which may include an interior enclosure exhaust plenum, based at least in part upon a chimney effect whereby the exhaust air rises through the internal exhaust plenum and out of one or more exhaust vents located on a top side of the free-standing exhaust plenum structure to rise out of the free-standing exhaust plenum structure and into the external environment. In some embodiments, exhaust air may be directed to the external environment based at least in part upon a pressure gradient between the internal exhaust air plenum and the external environment, which may be induced based at least in part upon one or more air moving devices that may be located in one or more of the external environment, exhaust vents, internal exhaust air plenum, some combination thereof, or the like.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
a data center row infrastructure module positioned in a data center interior space and configured to direct intake air to at least two rows of server racks and direct exhaust air away from the at least two rows of server racks and into at least a portion of the data center interior space, the data center row infrastructure module comprising:
a cold aisle space comprising a long axis and at least two separate rows of rack computing systems, wherein each row of rack computing systems is positioned on an opposite side of the long axis, and each rack computing system is configured to receive intake air on a front side facing the long axis and to discharge exhaust air on a rear side that faces away from the long axis;
at least two free-standing exhaust plenum structures, each mounted on the floor element adjacent to rear sides of separate ones of the at least two rows of rack computing systems on opposite sides of the cold aisle space, wherein each free-standing exhaust plenum structure comprises:
a frame structure that is configured to provide structural support to the free-standing exhaust plenum structure,
an internal exhaust air plenum at least partially bounded by the frame structure, wherein the internal exhaust air plenum is configured to receive the exhaust air from the rear side of an adjacent row of rack computer systems and direct the exhaust air into the portion of the data center interior space,
at least one set of wall elements coupled to the frame structure and substantially encompassing at least a portion of an aisle-facing side of the free-standing exhaust plenum structure that faces the cold aisle space, the at least one set of wall elements is configured to restrict airflow into the internal exhaust air plenum to exhaust air discharged from the rear sides of the adjacent row of rack computer systems; and
a plenum module spanning the cold aisle space between the at least two free-standing exhaust plenum structures to establish a lower boundary of a cooling air plenum above the plenum module and an upper boundary of the cold aisle space beneath the plenum module, wherein the plenum module comprises:
an intake air supply vent that is configured to direct at least a portion of cooling air circulating through the cooling air plenum into the cold aisle space to be supplied to the at least two rows of rack computing systems as intake air.

2. The data center of claim 1, the plenum module further comprising:
an air mixing plenum configured to mix cooling air received from the cooling air plenum with exhaust air received from the internal exhaust air plenum of at least one of the at least two free-standing exhaust plenum structures to provide intake air;
at least one set of dampers configured to direct the exhaust air from the internal exhaust air plenum of the at least one of the free-standing exhaust plenum structures into the air mixing plenum; and
an air moving device configured to supply the intake air from the air mixing plenum into the aisle space.

3. The data center of claim 1, wherein:
the data center interior space comprises an exhaust plenum configured to direct at least a portion of exhaust air discharged from the internal exhaust plenums of the at least two free-standing exhaust plenum structures to an ambient environment; and
the data center further comprises an air handling system coupled to the exhaust plenum and the cooling air plenum of the data center row infrastructure module, wherein the air handling system is configured to:
receive ambient air from the ambient environment;
receive at least another portion of the exhaust air from the exhaust plenum,
mix the other portion of the exhaust air and the ambient air to generate intake air; and
supply the intake air to the cooling air plenum of the data center row infrastructure module.

4. A data center row infrastructure module, comprising:
at least two free-standing exhaust plenum structures encompassing opposite side ends of an enclosure, wherein each free-standing exhaust plenum structure comprises:

an internal exhaust air plenum at least partially encompassed by wall elements, wherein the internal exhaust air plenum is configured to receive exhaust air from the enclosure and direct the received exhaust air through an exhaust air outlet on a top end of the free-standing exhaust plenum structure; and a plenum module spanning a top end of the enclosure between the at least two free-standing exhaust plenum structures to establish a bottom end of a cooling air plenum above and separate from the enclosure, the plenum module comprising at least a intake air supply vent configured to supply intake air from the cooling air plenum to the enclosure.

5. The data center row infrastructure module of claim 4, wherein the intake air supply vent of the plenum module comprises an air moving device configured to induce an airflow from the cooling air plenum to the enclosure to supply the intake air into the enclosure.

6. The data center row infrastructure module of claim 5, the plenum module further comprising:

an air mixing plenum, configured to mix cooling air received from the cooling air plenum with a flow of exhaust air received from at least one of the at least two exhaust plenum structures to provide the intake air that is supplied into the enclosure by the air moving device; and at least one set of dampers coupled to the at least one of the exhaust plenum structures and configured to direct the flow of exhaust air from the internal exhaust air plenum of the at least one of the exhaust plenum structures into the air mixing plenum.

7. The data center row infrastructure module of claim 6, wherein the at least one set of dampers are configured to be adjustably positioned to adjust a flow rate of the exhaust air into the air mixing plenum.

8. The data center row infrastructure module of claim 7, wherein the at least one set of dampers are configured to actively adjust the flow rate of the flow of exhaust air into the air mixing plenum based at least in part upon one or more characteristics of the intake air supplied into the enclosure.

9. The data center row infrastructure module of claim 4, wherein the wall elements comprise:

a particular wall element encompassing a particular portion of the internal exhaust air plenum at a common elevation with at least the cooling air plenum and at least partially at a greater elevation than the plenum module; and another particular wall element encompassing another particular portion of the internal exhaust air plenum at a common elevation with a portion of the enclosure, at least partially at a reduced elevation than the plenum module, and at least partially at a greater elevation than at least one rack computing system positioned within the enclosure.

10. The data center row infrastructure module of claim 4, comprising:

a plenum duct module, separate from the plenum module, that spans a top end of the cooling air plenum between the at least two free-standing exhaust plenum structures to establish at least a top end of the cooling air plenum.

11. The data center row infrastructure module of claim 4, wherein:

each of the exhaust plenum structures comprises a support structure configured to structurally support the plenum module above the enclosure, each support structure comprising:

at least one sealing element mounted on an upper surface of the support structure and configured to seal an interface between the upper surface of the support structure and a lower surface of the plenum module resting upon the support structure to restrict airflow between the cooling air plenum and the enclosure via the interface.

12. The data center row infrastructure module of claim 11, wherein:

each free-standing exhaust plenum structure comprises a shelving rack of a shelving pallet rack system, comprising at least a plurality of load-bearing frame members, that is adapted for encompassing the internal exhaust plenum and providing structural support to the free-standing exhaust plenum structure;

the support structure comprises a support structure of a drive-through pallet rack system that is adapted for coupling to an enclosure-facing side of the shelving rack of the shelving pallet rack system and for supporting at least a portion of a structural load of a plenum module resting upon the support structure.

13. The data center row infrastructure module of claim 4, comprising:

a data center infrastructure support module that hangs from at least a portion of the plenum module into the enclosure and structurally supports one or more of the following data center infrastructure components resting on at least a portion of an upper surface of the data center infrastructure support module:

one or more power transmission lines communicatively coupled to at least one rack computing system positioned within the enclosure;

one or more network cables communicatively coupled to at least one rack computing system positioned within the enclosure; and one or more lighting elements configured to illuminate at least a portion of the enclosure.

14. The data center row infrastructure module of claim 4, comprising:

a data center infrastructure support module that hangs from at least a portion of an enclosure-facing side of at least one of the at least two free-standing exhaust plenum structures into the enclosure and structurally supports one or more of the following data center infrastructure components resting on at least a portion of an upper surface of the data center infrastructure support module:

one or more power transmission lines communicatively coupled to at least one rack computing system positioned within the enclosure;

one or more network cables communicatively coupled to at least one rack computing system positioned within the enclosure; and one or more lighting elements configured to illuminate at least a portion of the enclosure.

15. A method, comprising:

mounting at least two free-standing exhaust plenum structures adjacent to opposite ends of a portion of a floor element, each of the at least two free-standing exhaust plenum structures encompassing an internal air plenum and extending substantially in parallel with a long axis of the portion of the floor element, to establish side ends of an enclosure;

mounting at least one plenum module on at least two separate support structures, each extending into the enclosure from an enclosure-facing side of a respective one of the at least two free-standing exhaust plenum structures, to establish a top end of the enclosure on a lower surface of the plenum module and to establish a bottom end of a cooling air plenum on an upper surface of the plenum module;

wherein the plenum module comprises at least one intake air supply vent and is configured to direct intake air from the cooling air plenum into the enclosure via the at least one intake air supply vent; and wherein each of the at least two free-standing exhaust plenum structures is configured to receive exhaust air from the enclosure into the internal air plenum of the respective exhaust plenum structure and direct the exhaust air out of the internal air plenum and into an external environment via an exhaust air supply vent.

16. The method of claim 15, wherein the plenum module comprises:

an air moving device configured to induce an airflow from the cooling air plenum to the enclosure to supply the intake air into the enclosure via the intake air supply vent;

an air mixing plenum, configured to mix cooling air received from the cooling air plenum with a flow of exhaust air received from at least one of the at least two free-standing exhaust plenum structures to provide the intake air that is supplied into the enclosure by the air moving device; and at least one set of dampers coupled to the at least one of the free-standing exhaust plenum structures and configured to direct the flow of exhaust air from the internal air plenum of the at least one of the exhaust plenum structures into the air mixing plenum.

17. The method of claim 16, comprising:

adjustably positioning or more of the at least one set of dampers to adjust a flow rate of the exhaust air into the air mixing plenum based at least in part upon one or more characteristics of the intake air supplied into the enclosure.

18. The method of claim 15, wherein mounting each of the at least two free-standing exhaust plenum structures adjacent to opposite ends of a portion of a floor element comprises:

coupling one or more wall elements to at least a particular side of a frame structure to at least partially encompass an interior space of the frame structure as the internal air plenum; and mounting the frame structure adjacent to a particular end of a portion of a floor element, wherein the particular side of the frame structure faces the portion of the floor element and establishes at least one side end of the enclosure.

19. The method of claim 15, comprising:

mounting a plenum duct module that is separate from the plenum module on separate portions each of the at least two free-standing exhaust plenum structures, such that the plenum duct module spans a top end of the cooling air plenum between the at least two free-standing exhaust plenum structures and establishes a top end of the cooling air plenum.

20. The method of claim 15, wherein mounting each of the at least two free-standing exhaust plenum structures adjacent to opposite ends of a portion of a floor element comprises:

adapting a shelving rack of a shelving pallet rack system, comprising at least a plurality of load-bearing frame members, to encompass the internal air plenum and provide structural support to the free-standing plenum structure; and adapting a support arm structure of a drive-through pallet rack system to couple to an enclosure-facing side of the shelving rack of the shelving pallet rack system and to support at least a portion of a structural load of a plenum module resting upon the support arm structure.

* * * * *